(12) United States Patent
Kim et al.

(10) Patent No.: US 12,232,390 B2
(45) Date of Patent: Feb. 18, 2025

(54) DISPLAY APPARATUS WITH ORGANIC LIGHT-EMITTING DIODES

(71) Applicant: Samsung Display Co., Ltd., Yongin-si (KR)

(72) Inventors: Hyeongpil Kim, Yongin-si (KR); Byounghun Sung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 374 days.

(21) Appl. No.: 17/371,103

(22) Filed: Jul. 9, 2021

(65) Prior Publication Data
US 2022/0157896 A1    May 19, 2022

(30) Foreign Application Priority Data
Nov. 13, 2020    (KR) .................... 10-2020-0152282

(51) Int. Cl.
*H10K 59/35*    (2023.01)
*H10K 50/15*    (2023.01)
(Continued)

(52) U.S. Cl.
CPC ........... *H10K 59/353* (2023.02); *H10K 50/15* (2023.02); *H10K 59/122* (2023.02); *H10K 59/38* (2023.02)

(58) Field of Classification Search
CPC .... H10K 59/352; H10K 59/122; H10K 50/15; H10K 50/14–157; H10K 50/11–131;
(Continued)

(56) References Cited

U.S. PATENT DOCUMENTS 7,821,201 B2    10/2010    Hatwar et al.
10,032,987 B2    7/2018    Ishii et al.
(Continued)

FOREIGN PATENT DOCUMENTS

CN    101447555 A    *  6/2009
CN    109103236 A    * 12/2018    ......... H01L 27/3206
(Continued)

OTHER PUBLICATIONS

Cyano-Isocyanide Iridium(III) Complexes with Pure Blue Phosphorescence, Louise M. Cañada, Johanna Kölling, Zhili Wen, Judy I-Chia Wu, and Thomas S. Teets, Inorganic Chemistry 2021 60 (9), 6391-6402 DOI: 10.1021/acs.inorgchem.1c00103.*
(Continued)

*Primary Examiner* — Aaron J Gray
*Assistant Examiner* — Mario Andres Autore, Jr.
(74) *Attorney, Agent, or Firm* — Lewis Roca Rothgerber Christie LLP

(57) ABSTRACT

A display apparatus includes: a first organic light-emitting diode, a second organic light-emitting diode, and a third organic light-emitting diode arranged on a substrate; a first intermediate layer commonly included in the first organic light-emitting diode and the second organic light-emitting diode, the first intermediate layer including a first emission layer and a first hole transport layer; a second intermediate layer included in the third organic light-emitting diode, the second intermediate layer including a second emission layer and a second hole transport layer; and a first color converting layer, a second color converting layer, and a third color converting layer. The first emission layer and the second emission layer are configured to emit different color lights from each other, and a hole mobility of the first hole transport layer is different from a hole mobility of the second hole transport layer.

17 Claims, 10 Drawing Sheets

(51) Int. Cl.
*H10K 59/122* (2023.01)
*H10K 59/38* (2023.01)

(58) Field of Classification Search
CPC ... H10K 59/10–221; H10K 59/30–353; H10K 50/19; H10K 59/38; H01L 27/3246; H01L 27/322
See application file for complete search history.

(56) References Cited

U.S. PATENT DOCUMENTS

| | | | |
|---|---|---|---|
| 10,439,008 B2 | 10/2019 | Cheng et al. | |
| 2010/0253209 A1 | 10/2010 | Splindler et al. | |
| 2011/0309346 A1* | 12/2011 | Watanabe | H10K 50/155 |
| | | | 257/E51.013 |
| 2013/0062635 A1* | 3/2013 | Higo | H10K 59/353 |
| | | | 257/E33.061 |
| 2016/0218150 A1* | 7/2016 | Hack | H10K 59/38 |
| 2016/0293864 A1* | 10/2016 | Forrest | H05B 33/14 |
| 2017/0012092 A1* | 1/2017 | Park | H10K 59/123 |
| 2017/0012231 A1* | 1/2017 | Mishima | H10K 59/12 |
| 2017/0155071 A1* | 6/2017 | Han | H10K 50/19 |
| 2017/0155073 A1* | 6/2017 | Kim | H10K 50/156 |
| 2017/0373251 A1* | 12/2017 | Hummert | C07D 239/30 |
| 2018/0005561 A1* | 1/2018 | Moon | G09G 3/3208 |
| 2018/0294419 A1* | 10/2018 | Fuchiwaki | C07D 221/08 |
| 2018/0358414 A1* | 12/2018 | Song | H10K 50/13 |
| 2019/0148648 A1 | 5/2019 | Lee et al. | |
| 2020/0044178 A1 | 2/2020 | Lim et al. | |
| 2021/0074945 A1* | 3/2021 | Kim | H10K 59/879 |
| 2022/0115460 A1* | 4/2022 | Sun | H10K 50/15 |
| 2022/0140273 A1* | 5/2022 | Yamazaki | H10K 50/15 |
| | | | 257/40 |

FOREIGN PATENT DOCUMENTS

| | | | | |
|---|---|---|---|---|
| JP | 6210745 | | 10/2017 | |
| KR | 20150082388 A | * | 7/2015 | |
| KR | 20190055285 | | 5/2019 | |
| KR | 2019064317 A | * | 6/2019 | ......... H01L 27/3211 |
| KR | 20190136692 | | 12/2019 | |
| KR | 20200014045 | | 2/2020 | |
| WO | WO-2018229859 A1 | * | 12/2018 | ............... G09F 9/00 |

OTHER PUBLICATIONS

Cyano-Isocyanide Iridium(III) Complexes with Pure Blue Phosphorescence, Louise M. Canada, Johanna Kolling, Zhili Wen, Judy I-Chia Wu, and Thomas S. Teets, Inorganic Chemistry 2021 60 (9), 6391-6402 DOI: 10.1021/acs.inorgchem.1c00103 (Year: 2021).*
https://www.sigmaaldrich.com/US/en/product/aldrich/697737.*

* cited by examiner

DISPLAY APPARATUS WITH ORGANIC LIGHT-EMITTING DIODES

CROSS-REFERENCE TO RELATED APPLICATION

This application claims priority from and the benefit of Korean Patent Application No. 10-2020-0152282, filed on Nov. 13, 2020, which is hereby incorporated by reference for all purposes as if fully set forth herein.

BACKGROUND

Field

Embodiments of the invention relate generally to a display apparatus and more specifically, to a display apparatus with organic light-emitting diodes.

Discussion of the Background

Display apparatuses visually display image data. Such display apparatuses include a substrate with a display area and a peripheral area. Scan lines and data lines are arranged in the display area and are insulated from each other. A plurality of subpixels are disposed in the display area. A thin-film transistor and a subpixel electrode electrically connected to the thin-film transistor are provided to be in correspondence with each of the subpixels in the display area. An opposite electrode in the display area commonly provided in the plurality of subpixels. Various wires are arranged in the peripheral area and transfer electrical signals to the display area, a scan driver, a data driver, a controller, a pad unit, etc.

Such display apparatuses have been applied to various technical areas. Accordingly, various design efforts for quality improvement of display apparatuses have been made.

The above information disclosed in this Background section is only for understanding of the background of the inventive concepts, and, therefore, it may contain information that does not constitute prior art.

SUMMARY

Display apparatuses with organic light-emitting diodes constructed according to the principles of the invention are capable of reducing power consumption, improving light conversion efficiency, and increasing lifespan thereof by providing various light conversion layers in the organic light-emitting diodes of the display apparatuses.

Additional features of the inventive concepts will be set forth in the description which follows, and in part will be apparent from the description, or may be learned by practice of the inventive concepts.

According to an aspect of the invention, a display apparatus includes a first subpixel for emitting a first color light, a second subpixel for emitting a second color light, and a third subpixel for emitting a third color light. The display apparatus includes a first organic light-emitting diode of the first subpixel, a second organic light-emitting diode of the second subpixel, and a third organic light-emitting diode of the third subpixel arranged on a substrate, a first intermediate layer commonly included in the first organic light-emitting diode and the second organic light-emitting diode, the first intermediate layer including a first emission layer and a first hole transport layer, a second intermediate layer included in the third organic light-emitting diode, the second intermediate layer including a second emission layer and a second hole transport layer, and a first color converting layer, a second color converting layer, and a third color converting layer arranged to overlap the first organic light-emitting diode, the second organic light-emitting diode, and the third organic light-emitting diode, respectively. The first emission layer and the second emission layer are configured to emit different color lights from each other, and a hole mobility of the first hole transport layer is different from a hole mobility of the second hole transport layer.

The first hole transport layer may be formed by doping hosts of an organic material with an oxide, and the second hole transport layer may be formed by doping the hosts with p-type organic dopants.

A dielectric constant of the oxide may be about 3 to about 60.

The oxide may include one of $HfO_x$, $ZrO_x$, $LaO_x$, $La_2O_3$, $LaAlO_x$, $TaO_x$, $AlO_x$, $Al_2O_3$, $SiO_2$, $ZrSiO_4$, $HfSiO_4$, $SrO$, $Y_2O_3$, $CaO$, $BaO$, $BaZrO$, $MgO$, $TiO_2$, and $Si_3N_4$.

A doping concentration of the oxide may be about 3% to about 30%.

The p-type organic dopants may include a cyano group-containing compound, and a doping concentration of the p-type organic dopants may be about 0.5% to about 25%.

The first hole transport layer may be formed by doping hosts of an organic material with an oxide at a first doping concentration, the second hole transport layer may be formed by doping the hosts of the organic material with the oxide at a second doping concentration, and the first doping concentration may be different from the second doping concentration.

The display apparatus may further include a bank arranged on the substrate and between the first emission layer and the second emission layer.

The bank may be arranged over a pixel defining layer that defines an emission area of the first, second, and third organic light-emitting diodes, and surround the third organic light-emitting diode.

The first intermediate layer may further include a $1\text{-}1^{st}$ emission layer arranged on the first emission layer, and the second intermediate layer may further include a $2\text{-}1^{st}$ emission layer arranged on the second emission layer.

The $1\text{-}1^{st}$ emission layer may include a same material as a material included in the $2\text{-}1^{st}$ emission layer.

The first emission layer may be configured to emit a green light, the second emission layer may be configured to emit a blue light, the first hole transport layer may be doped with p-type organic dopants, and the second hole transport layer may be doped with oxide.

According to another aspect of the invention, a display apparatus includes a first subpixel for emitting a first color light, a second subpixel for emitting a second color light, and a third subpixel for emitting a third color light. The display apparatus includes a first organic light-emitting diode of the first subpixel, a second organic light-emitting diode of the second subpixel, and a third organic light-emitting diode of the third subpixel arranged on a substrate, a first intermediate layer commonly included in the first organic light-emitting diode and the second organic light-emitting diode, the first intermediate layer comprising a first emission layer and a first hole transport layer, a second intermediate layer included in the third organic light-emitting diode, the second intermediate layer comprising a second emission layer and a second hole transport layer, and a bank arranged on the substrate to surround at least a portion of the second intermediate layer. The first emission layer and the second emission layer are configured to emit different color lights from each other.

A hole mobility of the first hole transport layer may be different from a hole mobility of the second hole transport layer.

The first emission layer may be configured to emit a green light, and the second emission layer may be configured to emit a blue light.

The first hole transport layer may be formed by doping hosts of an organic material with an oxide, and the second hole transport layer may be formed by doping the hosts f the organic material with p-type organic dopants.

The oxide may include one of HfOx, ZrOx, LaOx, La2O3, LaAlOx, TaOx, AlOx, Al2O3, SiO2, ZrSiO4, HfSiO4, SrO, Y2O3, CaO, BaO, BaZrO, MgO, TiO2, and $Si_3N_4$.

The p-type organic dopants may be a cyano group-containing compound, and a doping concentration of the p-type organic dopants may be about 0.5% to about 25%.

The first intermediate layer may further include a 1-$1^{st}$ emission layer arranged on the first emission layer, and the second intermediate layer may further include a 2-$1^{st}$ emission layer arranged on the second emission layer.

The 1-$1^{st}$ emission layer may include a same material as a material included in the 2-$1^{st}$ emission layer.

According to another aspect of the invention, A display apparatus includes: a first subpixel configured to emit a first color light, the first subpixel comprising a first organic light-emitting diode; a second subpixel configured to emit a second color light, the second subpixel comprising a second organic light-emitting diode; and a third subpixel configured to emit a third color light, the third subpixel comprising a third organic light-emitting diode, wherein: the first organic light-emitting diode and the second organic light-emitting diode are configured to emit a light having a first wavelength width, and the third organic light-emitting diode is configured to emit a light having a second wavelength width different from the first wavelength width.

The first organic light-emitting diode and the second organic light-emitting diode may commonly include a first emission layer configured to emit the light having the first wavelength width, and the third organic light-emitting diode may include a second emission layer configured to emit the light having the second wavelength width different from the first wavelength width.

The first subpixel may include a first color converting layer configured to convert the light having the first wavelength width into the first color light, the second subpixel may include a second color converting layer configured to convert the light having the first wavelength width into the second color light; and the third subpixel may include a transmissive layer configured to transmit the light having the second wavelength width as the third color light.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1A:
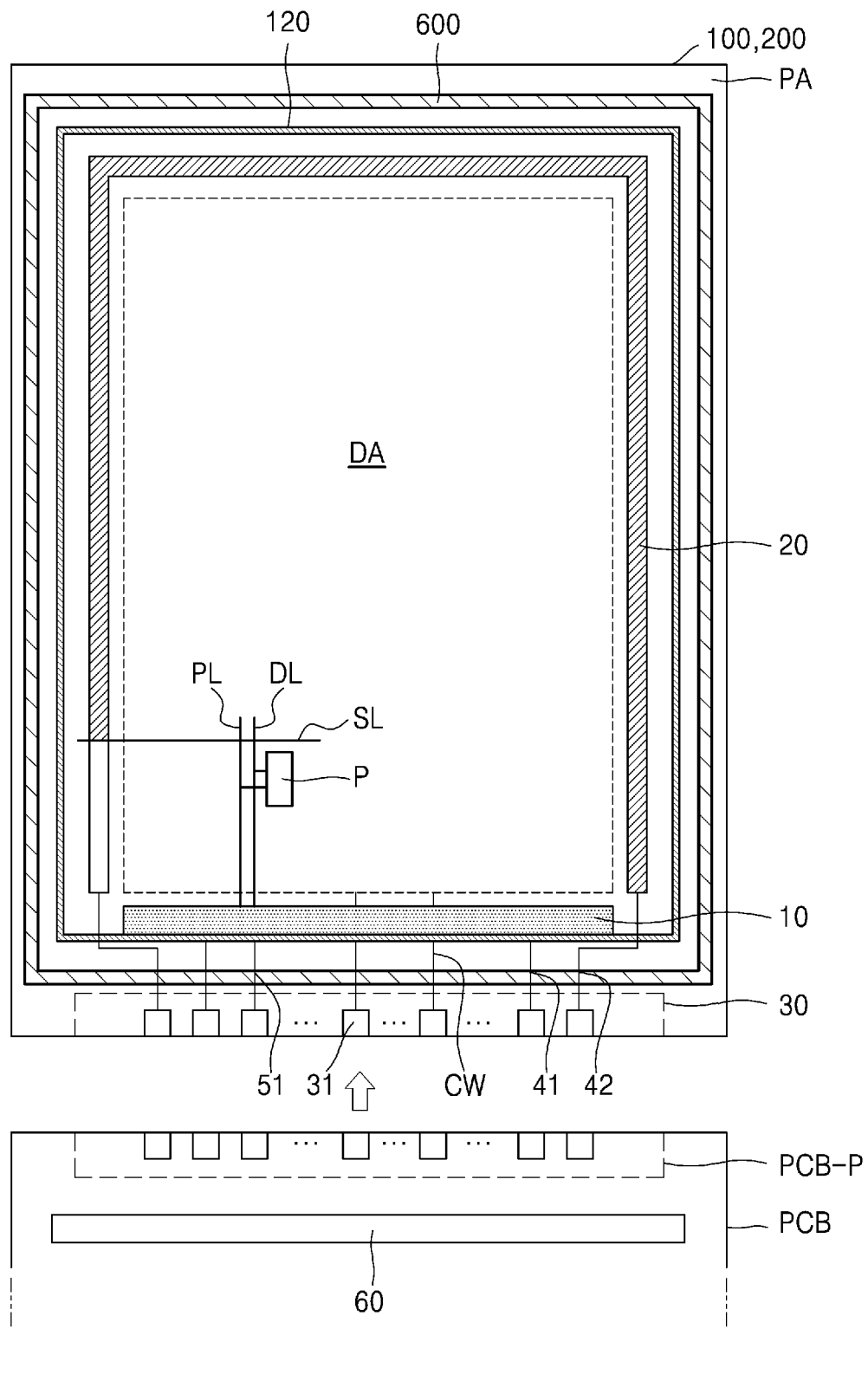
FIG. 1A is a plan view of an embodiment of a display apparatus constructed according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

A display apparatus, which displays an image, may be an organic light-emitting display apparatus, an inorganic light-emitting display apparatus, a quantum dot light-emitting display apparatus, or the like.

Although an organic light-emitting display apparatus will now be illustrated and described as a display apparatus according to an embodiment of the present invention, embodiments are not limited thereto, and various types of display apparatuses may be used.

Figure 1B:
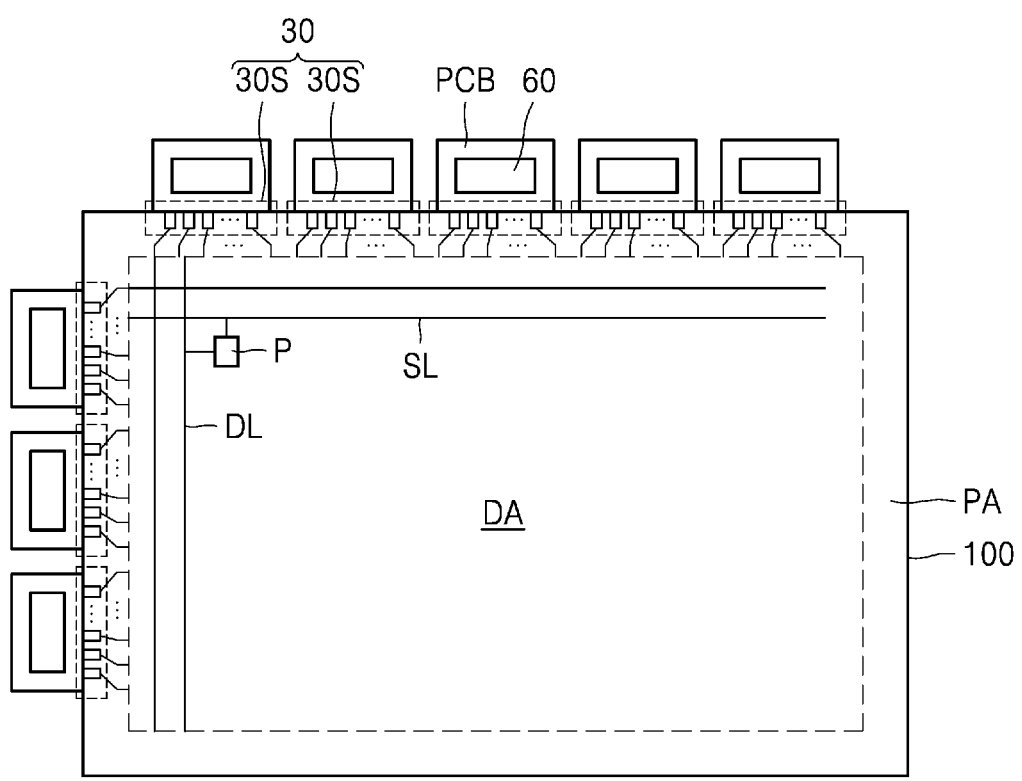
FIG. 1B is a plan view of another embodiment of the display apparatus of FIG. 1A.

FIGS. 1A and 1B are schematic plan views of display apparatuses according to embodiments.

Referring to FIG. 1A, the display apparatus may be formed by coupling a substrate 100 with an upper substrate 200 by a sealing member 600. The sealing member 600 may be disposed along the respective outer surfaces of the substrate 100 and the upper substrate 200 to surround the substrate 100 and the upper substrate 200, thereby coupling the substrate 100 with the upper substrate 200.

The display apparatus includes a display area DA and a peripheral area PA around the display area DA. The display apparatus may display a certain image by using light emitted from a plurality of pixels arranged in the display area DA.

The display area DA includes subpixels P connected to a data line DL extending in an x direction and a scan line SL extending in a y direction intersecting the x direction. Each of the subpixels P is also connected to a driving voltage line PL extending in the x direction.

Each of the subpixels P may include a display element, such as an organic light-emitting diode OLED. Each of the subpixels P may emit, for example, red light, green light, blue light, or white light, via an organic light-emitting diode OLED. According to some embodiments, in addition to the light emitted by the organic light-emitting diodes OLED included in the subpixels P, colors of the subpixels P may be realized or implemented by color filters disposed above the organic light-emitting diodes OLED.

Each of the pixels P may be electrically connected to embedded circuits arranged in the peripheral area PA. A first power supply line 10, a second power supply line 20, and a pad unit 30 may be located or disposed in the peripheral area PA.

The first power supply line 10 may be disposed along one side of the display area DA. The first power supply line 10 may be connected to a plurality of driving voltage lines PL configured to transmit a driving voltage ELVDD of FIGS. 2A and 2B to the subpixels P.

The second power supply line 20 may partially surround the display area DA by having a loop shape of which one side is open. The second power supply line 20 may provide a common voltage to the opposite electrode of the subpixels P. The second power supply line 20 may be referred to as a common voltage supply line.

The pad unit 30 may include a plurality of pads 31 and may be located or disposed on one side of the substrate 100. Each of the pads 31 may be connected to a first connection line 41 connected to the first power supply line 10 or a connection line CW extending to the display area DA. The pads 31 of the pad unit 30 may be exposed by not being covered by an insulating layer, and may be electrically connected to a printed circuit board PCB. A PCB terminal unit PCB-P of the printed circuit board PCB may be electrically connected to the pad unit 30.

The printed circuit board PCB transmits a signal or power of a controller to the pad unit 30. The controller may provide the driving voltage ELVDD and a common voltage ELVSS of FIGS. 2A and 2B to the first and second power supply lines 10 and 20 via first and second connection lines 41 and 42, respectively.

A data driving circuit 60 is electrically connected to the data lines DL. A data signal of the data driving circuit 150 may be provided to each of the subpixels P via the connection lines CW connected to the pad unit 30 and the data lines DL connected to the connection lines CW. FIG. 1A illustrates arrangement of the data driving circuit 60 on the printed circuit board PCB. However, according to another embodiment, the data driving circuit 60 may be arranged on the substrate 100. For example, the data driving circuit 60 may be between the pad unit 30 and the first power supply line 10.

Figure 4:
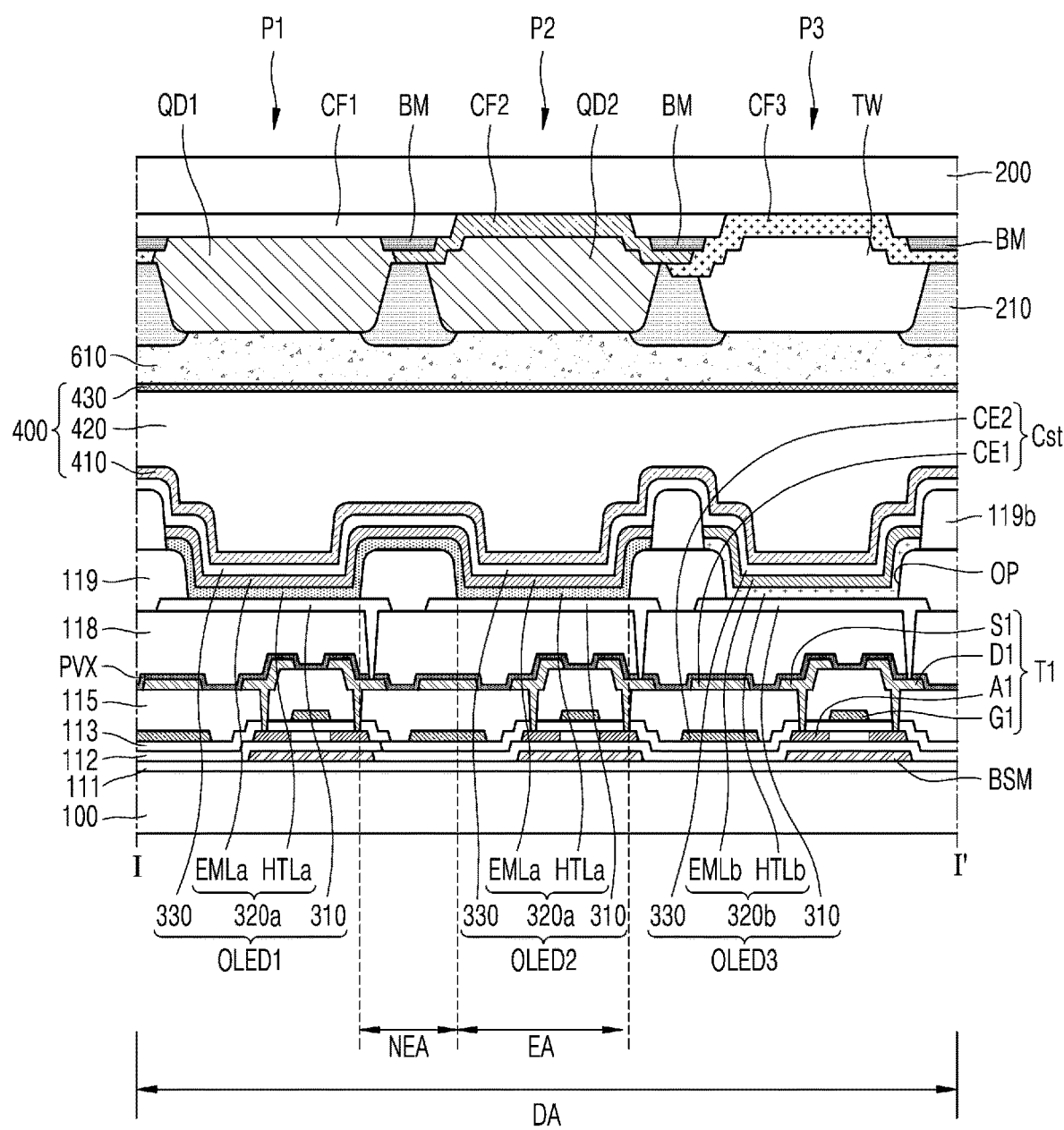
FIG. 4 is a cross-sectional view of a portion of a display area of the display apparatuses of FIGS. 1A and 1B.

A dam unit 120 may be arranged in the peripheral area PA. While an organic encapsulation layer 420 of a thin-film encapsulation layer 400 of FIG. 4 is formed, the dam unit 120 may block an organic material from flowing toward an edge of the substrate 100, thereby preventing formation of an edge tale of the organic encapsulation layer 420. The dam unit 120 may be arranged on the peripheral area PA to surround at least a portion of the display area DA. The dam unit 120 may include a plurality of dams. The plurality of dams may be arranged to be spaced apart from each other. The dam unit 120 may be arranged closer to the display area DA than the sealing member 600 is, in the peripheral area PA. The peripheral area PA may further include an embedded driving circuit unit that provides a scan signal of each of the subpixels. According to some embodiments, the embedded driving circuit unit and the dam unit 120 may overlap each other.

FIG. 1A illustrates that one printed circuit board PCB is attached to the pad unit 30. However, as shown in FIG. 1B, a plurality of printed circuit boards PCB may be attached to the pad unit 30.

The pad unit 30 may be arranged along two sides of the substrate 100. The pad unit 30 may include a plurality of sub-pad units 30s, and one printed circuit board PCB may be attached to each of the sub-pad units 30s.

Figure 2A:
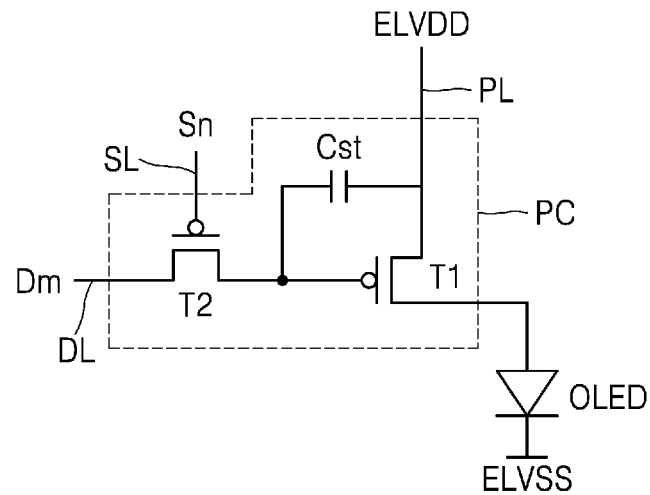
FIG. 2A is equivalent circuit diagram of an embodiment of a representative subpixel of the display apparatuses of FIGS. 1A and 1B.
Figure 2B:
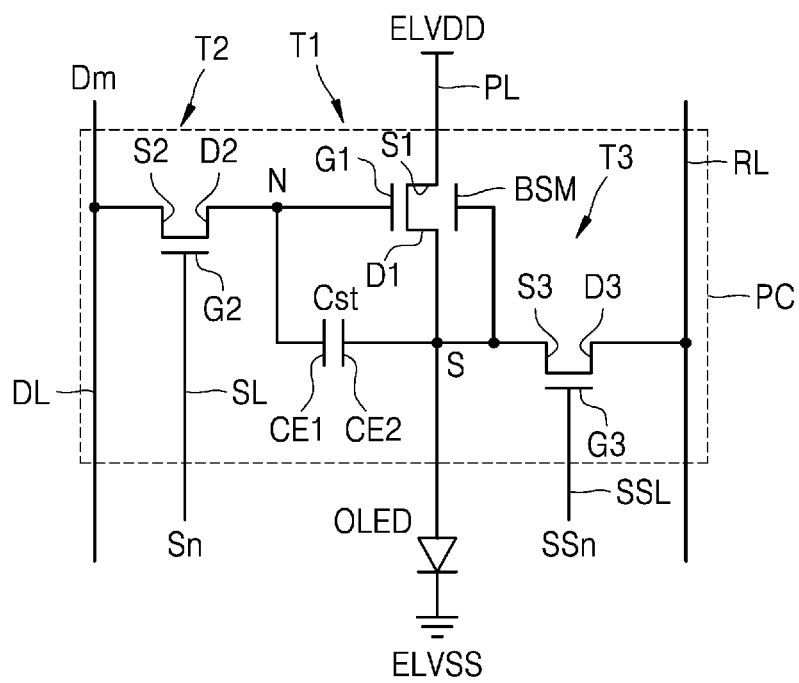
FIG. 2B is an equivalent circuit diagram of another embodiment of a representative subpixel of the display apparatuses of FIGS. 1A and 1B.

FIGS. 2A and 2B are equivalent circuit diagrams of a subpixel of a display apparatus according to an embodiment.

Referring to FIG. 2A, each subpixel P may be implemented by a pixel circuit PC connected to a scan line SL and a data line DL, and an organic light-emitting diode OLED connected to the pixel circuit PC. The pixel circuit PC includes a driving thin-film transistor T1, a switching thin-film transistor T2, and a storage capacitor Cst. The switching thin-film transistor T2 is connected to the scan line SL and the data line DL, and is configured to transmit, to the driving thin-film transistor T1, a data signal Dm received via the data line DL according to a scan signal Sn received via the scan line SL.

The storage capacitor Cst is connected to the switching thin-film transistor T2 and a driving voltage line PL, and stores a voltage corresponding to a difference between a voltage received from the switching thin-film transistor T2 and a first power supply voltage (or a driving voltage) ELVDD supplied to the driving voltage line PL.

The driving thin-film transistor T1 is connected to the driving voltage line PL and the storage capacitor Cst, and may be configured to control a driving current flowing from the driving voltage line PL to the organic light-emitting diode OLED, in accordance with a voltage value stored in the storage capacitor Cst. The organic light-emitting diode OLED may emit light having a certain brightness corresponding to the driving current.

Although a case where the pixel circuit PC includes two thin-film transistors and one storage capacitor is illustrated in FIG. 2A, embodiments are not limited thereto.

Referring to FIG. 2B, the pixel circuit PC may include a driving thin-film transistor T1, a switching thin-film transistor T2, a sensing thin-film transistor T3, and a storage capacitor Cst.

A scan line SL may be connected to a gate electrode G2 of the switching thin-film transistor T2, a data line DL may be connected to a source electrode S2 of the switching thin-film transistor T2, and a first electrode CE1 of the storage capacitor Cst may be connected to a drain electrode D2 of the switching thin-film transistor T2.

Accordingly, the switching thin-film transistor T2 is configured to supply a data voltage of the data line DL to a first node N in response to a scan signal Sn from the scan line SL of each subpixel P.

A gate electrode G1 of the driving thin-film transistor T1 may be connected to a first node N, a source electrode S1 of the driving thin-film transistor T1 may be connected to a driving voltage line PL configured to transmit the driving voltage ELVDD, and a drain electrode D1 of the driving thin-film transistor T1 may be connected to an anode of an organic light-emitting diode OLED.

Accordingly, the driving thin-film transistor T1 may adjust the amount of current flowing in the organic light-emitting diode OLED according to its own source-gate voltage Vgs, e.g., a voltage between the driving voltage ELVDD and the first node N.

A sensing control line SSL is connected to a gate electrode G3 of the sensing thin-film transistor T3, a source electrode S3 of the sensing thin-film transistor T3 is connected to a second node S, and a drain electrode D3 of the sensing thin-film transistor T3 is connected to a reference voltage line RL. According to some embodiments, the sensing thin-film transistor T3 may be controlled not by the sensing control line SSL but by the scan line SL.

The sensing thin-film transistor T3 may operate to sense a potential of a subpixel electrode (for example, an anode) of the organic light-emitting diode OLED. The sensing thin-film transistor T3 is configured to supply a pre-charging voltage from the reference voltage line RL to the second node S in response to a sensing signal SSn from the sensing control line SSL, or is configured to supply a voltage of the subpixel electrode (for example, the anode) of the organic light-emitting diode OLED to the reference voltage line RL during a sensing period.

A first electrode CE1 of the storage capacitor Cst is connected to the first node N, and a second electrode CE2 of the storage capacitor Cst is connected to the second node S. The storage capacitor Cst charges the voltage difference between voltages respectively supplied to the first and second nodes N and S, and supplies the charged voltage difference as the driving voltage of the driving thin-film transistor T1. For example, the storage capacitor Cst may charge the voltage difference between a data voltage Dm and a pre-charging voltage Vpre respectively supplied to the first and second nodes N and S.

A bias electrode BSM may be disposed to overlap the driving thin-film transistor T1 and may be connected to the source electrode S3 of the sensing thin-film transistor T3. As the bias electrode BSM supplies a voltage in connection with a potential of the source electrode S3 of the sensing thin-film transistor T3, the driving thin-film transistor T1 may be stabilized. According to some embodiments, the bias electrode BSM may be connected to special bias wires without being connected to the source electrode S3 of the sensing thin-film transistor T3.

An opposite electrode (for example, a cathode) of the organic light-emitting diode OLED receives a common voltage ELVSS. The organic light-emitting diode OLED receives the driving current from the driving thin-film transistor T1 and emits light.

Although each subpixel P includes signal lines such as the scan line SL, the sensing control line SSL, and the data line DL, the reference voltage line RL, and the driving voltage line PL in FIG. 2B, embodiments are not limited thereto. For example, at least one of the signal lines such as the scan line SL, the sensing control line SSL, and the data line DL, or/and the reference voltage line RL, and the driving voltage line PL may be shared by neighboring subpixels.

The pixel circuit PC is not limited to the number of thin-film transistors, the number of storage capacitors, and the circuit designs described above with reference to FIGS. 2A and 2B. The number of thin-film transistors, the number of storage capacitors, and the circuit design of the pixel circuit PC may vary.

Figure 3:
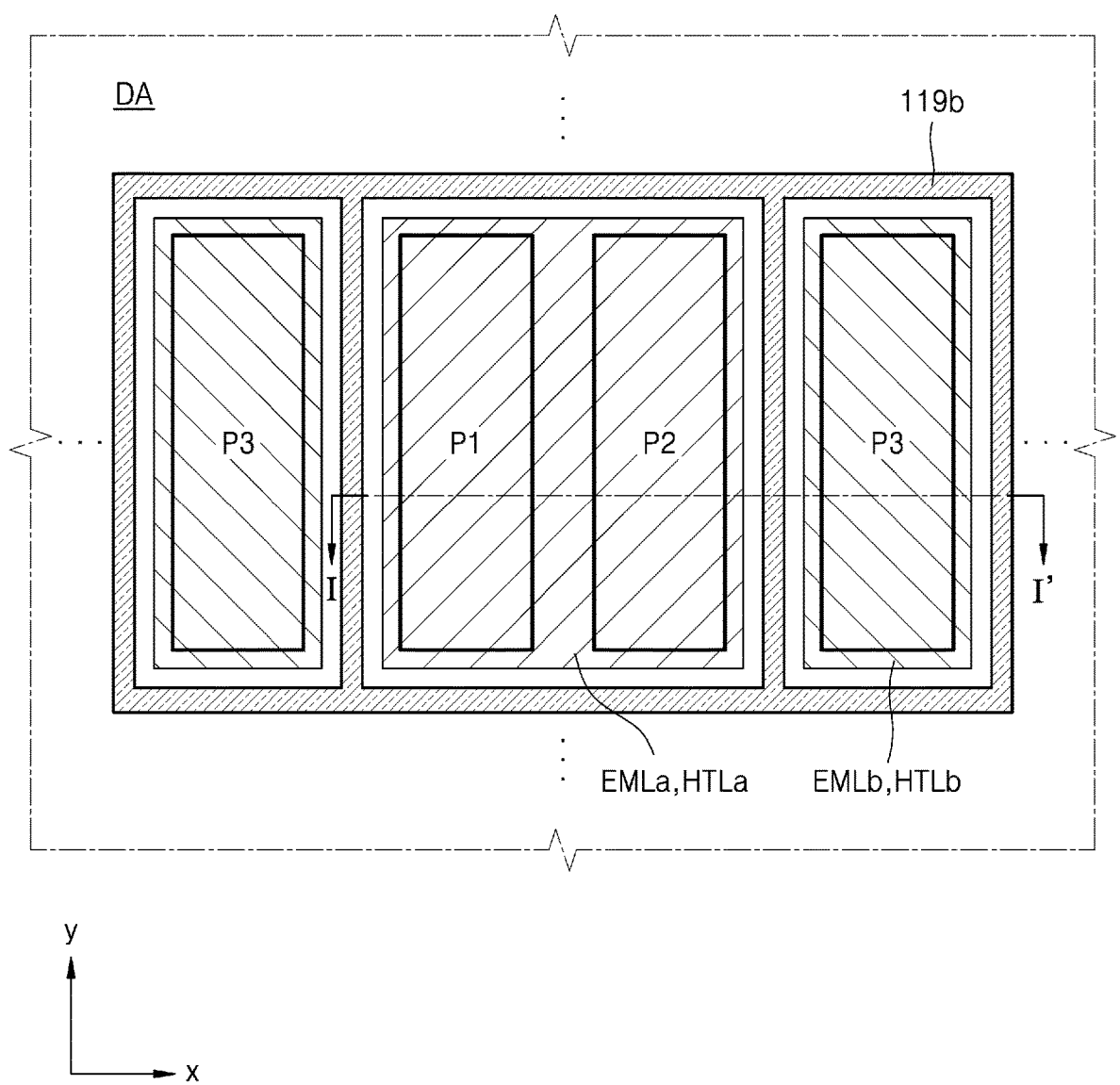
FIG. 3 is a plan view of a portion of a display area of the display apparatuses of FIGS. 1A and 1B.

FIG. 3 is a schematic plan view of a portion of a display area of a display apparatus according to an embodiment.

Referring to FIG. 3, a first subpixel P1, a second subpixel P2, and a third subpixel P3 for emitting different color lights may be arranged in the display area DA of the display apparatus according to an embodiment. For example, the first subpixel PX1 may emit red light, the second subpixel PX2 may emit green light, and the third subpixel PX3 may emit blue light.

Although FIG. 3 illustrates that the first subpixel P1, the second subpixel P2, and the third subpixel P3 are arranged in a stripe pattern where they are sequentially arranged in the x direction, embodiments are not limited thereto. The first subpixel P1, the second subpixel P2, and the third subpixel P3 may be arranged in any of various configurations such as a Pentile Matrix configuration, a Mosaic configuration, and a Delta configuration.

According to the illustrative embodiment, a first emission layer EMLa and a first hole transport layer HTLa may be arranged in an area of the first subpixel P1 and the second subpixel P2. A second emission layer EMLb and a second hole transport layer HTLb may be arranged in an area of the third subpixel P3. In other words, different emission layers and different hole transport layers may be arranged in an area where the first subpixel P1 and the second subpixel P2 are arranged and an area where the third subpixel P3 is arranged. The materials of the emission layers and the hole transport layers will be described later.

A bank 119b may be arranged to separate the area where the first subpixel P1 and the second subpixel P2 are arranged from the area where the third subpixel P3 is arranged. The bank 119b may be arranged between the first subpixel P1 and the third subpixel P3 and between the second subpixel P2 and the third subpixel P3. According to some embodiments, the bank 119b may be arranged to surround at least a portion of the third subpixel P3. The bank 119b may not be arranged between the first subpixel P1 and the second subpixel P2, and may be arranged to at least partially surround the first subpixel P1 and the second subpixel P2.

FIG. 4 is a cross-sectional view of a portion of the display area DA of a display apparatus according to an embodiment, and may correspond to line I-I' of FIG. 3.

Referring to FIG. 4, at least one thin-film transistor T1 and a display device connected to the at least one thin-film transistor (e.g., T1) may be disposed in the display area DA of the display apparatus according to an embodiment. In the display area DA of FIG. 4, the driving thin-film transistor T1 and the storage capacitor Cst included in the pixel circuit PC described above with reference to FIGS. 2A and 2B are illustrated.

The display area DA of the display apparatus includes a plurality of subpixels P1, P2, and P3, each of which includes an emission area EA. The emission area EA may be an area where light is generated and is emitted to the outside. A non-emission area NEA may be disposed between emission areas EA, and thus the emission areas EA of the first, second, and third subpixels P1, P2, and P3 may be divided by the non-emission areas NEA.

The display apparatus according to the illustrative embodiment may include a color converting layer in correspondence with at least one pixel. For example, as in the case of FIG. 3, a first color converting layer QD1 and a second color converting layer QD2 may correspond to the second subpixel P1 and the second subpixel P2, respectively. For example, the first color converting layer QD1 and the second color converting layer QD2 may overlap the second subpixel P1 and the second subpixel P2, respectively. The first and second color converting layers QD1 and QD2 may include quantum dots and scattering particles.

No color converting layers may correspond to an emission area of the third subpixel P3, and a transmissive layer in the form of a transmissive window TW may be disposed in the emission area of the third subpixel P3. The transmissive window TW may include an organic material from which light may be emitted without wavelength conversion of light emitted by an organic light-emitting diode OLED3 of the third subpixel P3.

First and second organic light-emitting diodes OLED1 and OLED2 respectively included in the first subpixel P1 and the second subpixel P2 may emit light of the same color. The organic light-emitting diode OLED3 of the third subpixel P3 may emit light of a different color from the color of light emitted by the first and second organic light-emitting diodes OLED1 and OLED2 respectively included in the first subpixel P1 and the second subpixel P2.

For convenience of explanation, components arranged in the display area DA will now be described according to a stacking order.

The substrate 100 may include a glass material, a metal material, or a material having flexible or bendable characteristics. When the substrate 100 has flexible or bendable characteristics, the substrate 100 may include a polymer resin, such as polyethersulphone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), or cellulose acetate propionate (CAP). The substrate 100 may have a structure of a single layer or multiple layers of any of the aforementioned materials. The multi-layered structure may further include an inorganic layer. In some embodiments, the substrate 100 may have a stacked structure of organic material/inorganic material/organic material.

A barrier layer may be further included between the substrate 100 and a first buffer layer 111. The barrier layer may prevent or minimize impurities from infiltrating into a semiconductor layer A1 through the substrate 100 and the like. The barrier layer may include an inorganic material (such as oxide or nitride), an organic material, or an organic and inorganic compound, and may be formed as a single layer or multiple layers of an inorganic material and an organic material.

A bias electrode BSM may be arranged on the first buffer layer 111 to overlap a driving thin-film transistor T1. A voltage may be applied to the bias electrode BSM. For example, the bias electrode BSM may be connected to the source electrode S3 of FIG. 2B of the sensing thin-film transistor T3 of FIG. 2B, and thus a voltage of the source electrode S3 may be applied to the bias electrode BSM. The bias electrode BSM may prevent external light from reaching the semiconductor layer A1. Accordingly, characteristics of the driving thin-film transistor T1 may be stabilized. In some embodiment, the bias electrode BSM may be omitted.

The semiconductor layer A1 may be arranged on a second buffer layer 112. The semiconductor layer A1 may include amorphous silicon or polysilicon. According to another embodiment, the semiconductor layer A1 may include oxide of at least one of indium (In), gallium (Ga), tin (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). According to some embodiments, the semiconductor layer A1 may be formed of Zn oxide, In—Zn oxide, Ga—In—Zn oxide, or the like as a Zn oxide-based material. According to other embodiments, the semiconductor layer A1 may be an In—Ga—Zn—O (IGZO), In—Sn—Zn—O (ITZO), or In—Ga—Sn—Zn—O (IGTZO) semiconductor containing a metal, such as In, Ga, or Sn, in ZnO. The semiconductor layer A1 may include a channel region, and a source region and a drain region respectively arranged on both sides of the channel region. The semiconductor layer A1 may have a single-layer or multi-layer structure.

A gate electrode G1 is arranged on the semiconductor layer A1 with a gate insulating layer 113 therebetween, and at least a portion of the gate electrode G1 overlaps the semiconductor layer A1. The gate electrode G1 may include, for example, molybdenum (Mo), aluminum (Al), copper (Cu), or titanium (Ti), and may have a single layer or multi-layer structure. For example, the gate electrode G1 may be a single layer of Mo. The first electrode CE1 of the storage capacitor Cst may be arranged on the same layer as the layer on which the gate electrode G1 is arranged. The first electrode CE1 may be formed of the same material as the gate electrode G1.

An interlayer insulating layer 115 may cover the gate electrode G1 and the first electrode CE1 of the storage capacitor Cst. The interlayer insulating layer 115 may include silicon oxide ($SiO_2$), silicon nitride ($SiN_X$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like.

The second electrode CE2 of the storage capacitor Cst, the source electrode S1, the drain electrode D1, and the data line DL may be arranged over the interlayer insulating layer 115.

The second electrode CE2 of the storage capacitor Cst, the source electrode S1, the drain electrode D1, and the data line DL may include a conductive material including molybdenum (Mo), aluminum (Al), copper (Cu), and titanium (Ti), and may be formed as a multi-layer or single layer including the aforementioned materials. For example, each of the second electrode CE2, the source electrode S1, the drain electrode D1, and the data line DL may have a multi-layer structure of Ti/Al/Ti. The source electrode S1 and the drain electrode D1 may be connected to a source region or drain region of the semiconductor layer A1 through a contact hole.

The second electrode CE2 of the storage capacitor Cst overlaps the first electrode CE1 with the interlayer insulating layer 115 therebetween, and forms a capacitance. In this case, the interlayer insulating layer 115 may function as a dielectric layer of the storage capacitor Cst.

The second electrode CE2 of the storage capacitor Cst, the source electrode S1, the drain electrode D1, and the data line DL may be covered by an inorganic protective layer PVX.

The inorganic protective layer PVX may be a single layer or multi-layer of silicon nitride (SiNx) and silicon oxide (SiOx). The inorganic protective layer PVX may be employed to cover and protect some wires disposed on the interlayer insulating layer 115. Wires, which is formed during the same process as the process for forming the data line DL, may be exposed in a partial area (for example, a portion of a peripheral area) of the substrate 100. Exposed portions of the wires may be damaged by an etchant that is used to pattern a pixel electrode 310 which will be described later. However, as the inorganic protective layer PVX covers the data line DL and at least a portion of the wires formed together with the data line DL as in the illustrative embodiment, the wires may be prevented from being damaged during a process of patterning the pixel electrode 310.

A planarization layer 118 may be arranged on the inorganic protective layer PVX, and first, second, and third organic light-emitting diodes OLED1, OLED2, and OLED3 may be arranged on the planarization layer 118.

The planarization layer 118 may have a single-layer or multi-layer structure of a layer including an organic material, and provides a flat upper surface. The planarization layer 118 may include a commercial polymer such as benzocyclobutene (BCB), polyimide (PI), hexamethyldisiloxane (HMDSO), polymethyl methacrylate (PMM) or polystyrene (PS), a polymer derivative having a phenol-based group, an acryl-based polymer, an imide-based polymer, an acryl ether-based polymer, an amide-based polymer, a fluorine-based polymer, a p-xylene-based polymer, a vinyl alcohol-based polymer, a mixture thereof, or the like.

In the display area DA of the substrate 100, the first, second, and third organic light-emitting diodes OLED1, OLED2, and OLED3 are arranged on the planarization layer 118. The first organic light-emitting diode OLED1 may be arranged on an area of the first subpixel P1, the second organic light-emitting diode OLED2 may be arranged on an area of the second subpixel P2, and the third organic light-emitting diode OLED3 may be arranged on an area of the third subpixel P3. Each of the first, second, and third organic light-emitting diodes OLED1, OLED2, and OLED3 includes the pixel electrode 310, an intermediate layer including an emission layer, and an opposite electrode 330.

The pixel electrode 310 may be formed on the planarization layer 118 to be patterned according to the first, second, and third organic light-emitting diodes OLED1, OLED2, and OLED3. The pixel electrode 310 may be electrically connected to a pixel circuit PC.

The pixel electrode 310 may be a light-transmissive electrode, a semi-light-transmissive electrode, or a reflective electrode. According to some embodiments, the pixel electrode 310 may include a reflective layer formed of silver (Ag), magnesium (Mg), aluminum (Al), platinum (Pt), palladium (Pd), gold (Au), nickel (Ni), neodymium (Nd), iridium (Ir), chromium (Cr), or a compound thereof, and a transparent or semi-transparent electrode layer formed on the reflective layer. The transparent or semi-transparent electrode layer may include at least one of indium tin oxide (ITO), indium zinc oxide (IZO), zinc oxide (ZnO), indium oxide (In2O3), indium gallium oxide (IGO), aluminum zinc oxide (AZO), and the like. According to some embodiments, the pixel electrode 310 may have a stack structure of ITO/Ag/ITO.

A pixel defining layer 119 may be arranged on the planarization layer 118. The pixel defining layer 119 may include openings respectively corresponding to the subpixels, e.g., openings OP exposing at least center portions of the pixel electrodes 310, in the display area DA, and accordingly define emission areas of subpixels. The pixel defining layer 119 may prevent an electric arc or the like from occurring on the edges of the pixel electrodes 310 by increasing distances between the edges of the pixel electrodes 310 and portions of the opposite electrode 330 that are on the pixel electrodes 310.

The pixel defining layer 119 may be formed of at least one organic insulating material among polyimide, polyamide, acryl resin, benzocyclobutene, and a phenolic resin, by using a method such as a spin coating process.

The first and second organic light-emitting diodes OLED1 and OLED2 may include a first intermediate layer 320a, and the first intermediate layer 320a may include a first emission layer EMLa and a first hole transport layer HTLa. The third organic light-emitting diode OLED3 may include a second intermediate layer 320b. The second intermediate layer 320b may include a second emission layer EMLb and a second hole transport layer HTLb. The first, second, and third organic light-emitting diodes OLED1, OLED2, and OLED3 may further include functional layers, such as a hole injection layer (HIL), an electron transport layer (ETL), and an electron injection layer (EIL), arranged below and above the emission layers EMLa and EMLb.

According to the illustrative embodiment, the first organic light-emitting diode OLED1 and the second organic light-emitting diode OLED2 may commonly include the first emission layer EMLa and the first hole transport layer HTLa, and the third organic light-emitting diode OLED3 may include the second emission layer EMLb and the second hole transport layer HTLb.

The first emission layer EMLa may emit light of a different color from the color of the light emitted by the second emission layer EMLb. According to some embodiments, the first emission layer EMLa may include an organic material that emits green light, and the second emission layer EMLb may include an organic material that emits blue light.

The first emission layer EMLa may be formed by using, for example, green dopants in a certain host material. For example, the first emission layer EMLa may include a phosphorescent host material such as Tris(4-carbazoyl-9-ylphenyl)amine (TCTA), 4,4'-Bis(N-carbazolyl)-1,1'-biphenyl (CBP), Bis(8-hydroxy-2-methylquinoline)-(4-phenylphenoxy)aluminum) (Balq), and poly(p phenylene vinylene) (PPV). The first emission layer EMLa may be doped with phosphorescent dopants such as Ir(ppy)3 or Ir(mmapy)3.

The second emission layer EMLb may be formed by using, for example, blue dopants in a certain host material. For example, the second emission layer EMLb may include a host material including CBP or mCP, and may be formed of a phosphorescent material including a dopant material including (4,6-F2ppy)2Irpic. In contrast, the second emission layer EMLb may include a fluorescent material including one of spiro-DPVBi, spiro-6P, distillbenzene (DSB), distrylarylene (DSA), PFO-based polymer, and PPV-based polymer. However, embodiments are not limited thereto.

The first hole transport layer HTLa may be between the pixel electrodes 310 and the first emission layer EMLa of the first organic light-emitting diode OLED1 and the second organic light-emitting diode OLED2, and the second hole transport layer HTLb may be between the pixel electrode 310 and the second emission layer EMLb of the third organic light-emitting diode OLED3.

The first and second hole transport layers HTLa and HTLb may smoothly move holes received from the pixel electrodes 310, which are anodes, to the first and second emission layers EMLa and EMLb, and may bind electrons received from the opposite electrode 330, which is a cathode, to the first and second emission layers EMLa and EMLb.

According to the illustrative embodiment, a hole mobility of the first hole transport layer HTLa may be different from a hole mobility of the second hole transport layer HTLb. According to some embodiments, the hole mobility of the first hole transport layer HTLa may be less than the hole mobility of the second hole transport layer HTLb.

According to some embodiments, the first hole transport layer HTLa and the second hole transport layer HTLb may include, as the hosts of a hole transport layer, a triphenylamine derivative having a high hole mobility and a good stability, such as N,N'-diphenyl-N,N'-bis(3-methylphenyl)-1,1'-bi-phenyl-4,4'-diamine (TPD) or N,N'-di(naphthalen-1-yl)-N,N'-diphenyl-benzidine (NPB).

To adjust the hole mobilities of the first hole transport layer HTLa and the second hole transport layer HTLb, the hosts of the first hole transport layer HTLa may be doped with P-type organic dopants, thereby increasing the hole mobility. The P-type organic dopants may be quinone derivatives such as tetracyanoquinonedimethane (TCNQ) and 2,3,5,6-tetrafluoro-tetracyano-1,4-benzoquinonedimethane (F4-TCNQ), or a cyano group-containing compound such as 2-(7-dicyanomethylene-1,3,4,5,6,8,9,10-octafluoro-7H-pyrene-2-ylidene)-malononitrile (NDP-9; a commercial product by Novaled Corporation).

A doping concentration of the P-type organic dopants may be about 0.5% to about 25%.

The hole mobility of the second hole transport layer HTLb may be reduced by doping the hosts with oxide having a high dielectric constant. The dielectric constant of the oxide may be in the range of about 3 to about 60. The oxide may include one of $HfO_X$, $ZrO_X$, $LaO_X$, $La_2O_3$, $LaAlO_X$, $TaO_X$, $AlO_X$, $Al_2O_3$, $SiO_2$, $ZrSiO_4$, $HfSiO_4$, SrO, $Y_2O_3$, CaO, BaO, BaZrO, MgO, $TiO_2$, and $Si_3N_4$. In this case, a doping concentration of the oxide may be about 0.5% to about 30%.

According to another embodiment, the hole mobilities of the first hole transport layer HTLa and the second hole transport layer HTLb may be adjusted by doping the hosts thereof with oxide having a high dielectric constant. For example, a doping concentration of oxide doped in the first hole transport layer HTLa is less than that of oxide doped in the second hole transport layer HTLb so that the hole mobility of the first hole transport layer HTLa may be higher than that of the second hole transport layer HTLb.

According to the illustrative embodiment, as the colors, which are finally represented or created by the first, second, and third subpixels P1, P2, and P3, are colors that are seen outside the upper substrate 200, a voltage supplied to the first, second, and third organic light-emitting diodes OLED1, OLED2, and OLED3 may vary according to light conversion efficiency of the first color converting layer QD1 and the second color converting layer QD2 when the emission layer is applied to the first, second, and third organic light-emitting diodes OLED1, OLED2, and OLED3.

For example, when a blue emission layer is applied to all of the first, second, and third organic light-emitting diodes OLED1, OLED2, and OLED3, the first and second subpixels P1 and P2 representing a red color or a green color need light conversion by color converting layers. Thus, a greater driving voltage may need to be supplied to the first and second organic light-emitting diodes OLED1 and OLED2. As a result, when the first and second subpixels P1 and P2 provide the same brightness as the brightness provided by the third subpixel P3 representing a blue color, power consumption may be sharply increased.

According to the illustrative embodiment, the first emission layer EMLa are employed by the first and second organic light-emitting diodes OLED1 and OLED2 in consideration of the light conversion efficiency, and the second emission layer EMLb representing a different color from the first emission layer EMLa is employed by the third organic light-emitting diode OLED3. Thus, power consumption may be reduced, and light conversion efficiency may be improved.

Organic light-emitting diodes may have different lifespans according to the types of emission layers employed thereby. For example, a blue emission layer may have a shorter lifespan than green and red emission layers.

According to the illustrative embodiment, the durability of an organic light-emitting diode may be improved by adjusting the hole mobility of a hole transport layer according to the durability of an emission layer. In other words, the first hole transport layer HTLa having a high hole mobility may be employed below the first emission layer EMLa having a relatively long lifespan and the second hole transport layer HTLb having a low hole mobility may be employed below the second emission layer EMLb having a relatively short lifespan, and thus the first, second, and third organic light-emitting diodes OLED1, OLED2, and OLED3 may have uniform lifespans.

The opposite electrode 330 may be a cathode which is an electron injection electrode. In this case, a metal, an alloy, an electroconductive compound, or any combination thereof, having a low work function, may be used as a material for the opposite electrode 330. The opposite electrode 330 may be a light-transmissive electrode, a semi-light-transmissive electrode, or a reflective electrode.

The opposite electrode 330 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The opposite electrode 330 may have a single-layer structure including a single layer, or a multi-layer structure including a plurality of layers.

The opposite electrode 330 may extend over the display area DA and the peripheral area, and may be arranged over the intermediate layer 320 and the pixel defining layer 119. The opposite electrode 330 may be integrally formed to cover a plurality of organic light-emitting diodes, e.g., the first, second, and third organic light-emitting diodes OLED1, OLED2, and OLED3, and thus may correspond to a plurality of pixel electrodes 310.

The bank 119b may be arranged over the pixel defining layer 119. The bank 119b may be integrally formed with the pixel defining layer 119. For example, the bank 119b and the pixel defining layer 119 may be simultaneously formed according to the same process by using a half tone mask process. According to some embodiments, the bank 119b may include a liquid-repellent material.

The bank 119b may be a structure for separating the first emission layer EMLa from the second emission layer EMLb. The bank 119b may be between the first organic light-emitting diode OLED1 and the third organic light-emitting diode OLED3 and between the second organic light-emitting diode OLED2 and the third organic light-emitting diode OLED3. The bank 119b may not be disposed between the first organic light-emitting diode OLED1 and the second organic light-emitting diode OLED2.

As the first, second, and third organic light-emitting diodes OLED1, OLED2, and OLED3 may be easily damaged by external moisture, external oxygen, or the like, the first, second, and third organic light-emitting diodes OLED1, OLED2, and OLED3 may be covered and protected by a thin-film encapsulation layer 400. The thin-film encapsulation layer 400 may cover the display area DA and extend beyond the display area DA. The thin-film encapsulation layer 400 includes at least one organic encapsulation layer and at least one inorganic encapsulation layer. For example, the thin-film encapsulation layer 400 may include a first inorganic encapsulation layer 410, an organic encapsulation layer 420, and a second inorganic encapsulation layer 430.

The first inorganic encapsulation layer 410 may cover the opposite electrode 330 and may include a silicon oxide, a silicon nitride, and/or a silicon oxynitride. For example, other layers (e.g., a capping layer) may be between the first inorganic encapsulation layer 410 and the opposite electrode 330. As the first inorganic encapsulation layer 410 is formed along a structure below the first inorganic encapsulation layer 410, the upper surface thereof is not flat. The organic encapsulation layer 420 covers the first inorganic encapsulation layer 410. In contrast with the first inorganic encapsulation layer 410, the organic encapsulation layer 420 may have an approximately flat upper surface. In detail, a portion of the organic encapsulation layer 420 corresponding to the display area DA may have an approximately flat upper surface. The organic encapsulation layer 420 may include at least one material among polyethylene terephthalate, polyethylene naphthalate, polycarbonate, polyimide, polyethylene sulfonate, polyoxymethylene, polyarylate, and hexamethyldisiloxane. The second inorganic encapsulation layer 430 may cover the organic encapsulation layer 420 and may include a silicon oxide, a silicon nitride, and/or a silicon oxynitride.

Even when cracks occur in the thin-film encapsulation layer 400 having the above-described multi-layered structure, the occurred cracks may not extend between the first inorganic encapsulation layer 410 and the organic encapsulation layer 420 or between the organic encapsulation layer 420 and the second inorganic encapsulation layer 430 due to the above-described multi-layered structure of the thin-film encapsulation layer 400. Accordingly, formation of a path via which external moisture, oxygen, or the like permeates into the display area DA may be prevented or minimized.

A filler 610 may be disposed on the thin-film encapsulation layer 400. The filler 610 may function as a buffer layer against external pressure, etc. The filler 610 may include an organic material such as methyl silicone, phenyl silicone, or polyimide. However, embodiments are not limited thereto. For example, the filler 610 may include an organic sealant such as a urethane-based resin, an epoxy-based resin, or an acrylic resin, or an inorganic sealant such as silicon.

The first and second color converting layers QD1 and QD2, the transmissive window TW, and partition walls 210 may be arranged over the upper substrate 200 arranged to face the substrate 100. The partition walls 210 may include scattering particles.

Each of the first and second color converting layers QD1 and QD2 may include quantum dots. In the descriptions, quantum dots refer to crystals of a semiconductor compound, and may include any material capable of emitting light of various emission wavelengths according to the sizes of the crystals.

The quantum dots have unique excitation properties and unique emission properties depending on the material and size thereof and accordingly may convert incident light into light of certain color. The quantum dots may be formed of various materials. For example, the quantum dots may include a Groups II-VI elements-containing compound, a Groups III-V elements-containing compound, a Groups III-VI elements-containing compound, a Groups I-III-VI elements-containing semiconductor compound, a Groups IV-VI elements-containing semiconductor compound, a Group IV element, a Group IV element-containing compound, or any combination thereof.

The Groups II-VI elements-containing compound may be one compound among a two-element compound selected from CdSe, CdTe, ZnS, ZnSe, ZnTe, ZnO, HgS, HgSe, HgTe, MgSe, MgS, and a mixture thereof; a three-element compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a four-element compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Groups III-V elements-containing compound may be one compound among a two-element compound selected from GaN, GaP, GaAs, GaSb, AlN, AlP, AlAs, AlSb, InN, InP, InAs, InSb, and a mixture thereof a three-element compound selected from GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and a mixture thereof; and a four-element compound selected from GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The Groups III-V elements-containing semiconductor compound may further include a Group II element. Examples of the Groups III-V elements-containing semiconductor compound further including a Group II element may include InZnP, InGaZnP, and InAlZnP.

Examples of the Groups III-VI elements-containing semiconductor compound may include a two-element compound such as GaS, GaSe, $Ga_2Se_3$, GaTe, InS, InSe, $In_2S_3$, $In_2Se_3$, or InTe; a three-element compound such as $InGaS_3$ or $InGaSe_3$; or any combination thereof.

Examples of the Groups elements-containing semiconductor compound may include a three-element compound such as AgInS, AgInS2, CuInS, CuInS2, CuGaO2, AgGaO2, or AgAlO2; or any combination thereof.

The Groups IV-VI elements-containing compound may be one compound among a two-element compound selected from SnS, SnSe, SnTe, PbS, PbSe, PbTe, and a mixture thereof; a three-element compound selected from SnSeS, SnSeTe, SnSTe, PbSeS, PbSeTe, PbSTe, SnPbS, SnPbSe, SnPbTe, and a mixture thereof; and a four-element compound selected from SnPbSSe, SnPbSeTe, SnPbSTe, and a mixture thereof.

The Group IV element may be one of Si, Ge, and a mixture thereof. The Group IV element-containing compound may be a two-element compound selected from SiC, SiGe, and a mixture thereof.

In this case, the two-element compound, the three-element compound, or the four-element compound may be present in particles at a uniform concentration, or may have a concentration distribution partially divided into different states within the same particle.

Each of the quantum dots may have a core-shell structure having a core and a shell. An interface between the core and the shell may have a concentration gradient in which the concentration of elements disposed in the shell is decreased as moving toward the center of the shell.

The shell of the quantum dot may serve as a protective layer for maintaining semiconductor properties by preventing chemical denaturation of the core and/or may serve as a charging layer for imparting electrophoretic properties to the quantum dot. The shell may be a single layer or a multilayer.

Examples of the shell of the quantum dot may include oxide of a metal, a metalloid, or a non-metal, a semiconductor compound, or a combination thereof. Examples of the oxide of a metal, a metalloid, or a non-metal may include a two-element compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO; a three-element compound such as $MgAl_2O_4$, $CoFe_2O_4$, $NiFe_2O_4$, or $CoMn_2O_4$; and any combination thereof. Examples of the semiconductor compound may include a Groups III-VI elements-containing semiconductor compound; a Groups II-VI elements-containing semiconductor compound; a Groups III-V elements-containing semiconductor compound; a Groups III-VI elements-containing semiconductor compound; a Groups elements-containing semiconductor compound; a Groups IV-VI elements-containing semiconductor compound; and any combination thereof, as mentioned above. For example, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

The quantum dot may have a size of about 45 nm or less, or about 40 nm or less, or about 30 nm or less, and in this range, color purity or color reproducibility may be improved. In addition, as light emitted through such quantum dots is emitted in all directions, the viewing angle of the light may be improved.

Moreover, the shape of the quantum dot is particularly limited to a shape generally used in the art, but may be a sphere, a pyramid, a multi-arm, or a shape of a cubic nanoparticle, a cubic nanotube, a cubic nanowire, a cubic nanofiber, or a cubic nanoplate particle.

The core of the quantum dot may have a diameter of 2 nm to 10 nm, and when the quantum dot is exposed to light, light of a specific frequency may be emitted according to the size of a particle and the type of material. Thus, an average size of quantum dots included in the first color converting layer QD1 may be different from that of quantum dots included in the second color converting layer QD2. For example, as the size of the quantum dot increases, a color of a long wavelength may be emitted. Thus, the size of the quantum dot may be selected in accordance with the colors of the first subpixel P1 and the second subpixel P2.

The first and second color converting layers QD1 and QD2 may further include various materials capable of mixing the quantum dots and appropriately distributing the quantum dots, in addition to the quantum dots. For example, the first and second color converting layers QD1 and QD2 may further include scattering particles, a solvent, a photoinitiator, a binder polymer, and a dispersant.

No color converting layers may correspond to an emission area of the third subpixel P3, and a transmissive window TW may be disposed in the emission area of the third subpixel P3. The transmissive window TW may include an organic material from which light may be emitted without wavelength conversion of light emitted by the third organic light-emitting diode OLED3 of the third subpixel P3. The transmissive window TW may include scattering particles for uniformization of color spreading. In this case, scattering particles may have a diameter in the range of about 200 nm to about 400 nm.

According to the illustrative embodiment, the first organic light-emitting diode OLED1 in the first subpixel P1 and the second organic light-emitting diode OLED2 in the second subpixel P2 may emit light of the same color (e.g., light of a first wavelength width). The colors of the first subpixel P1 and the second subpixel P2 may be determined, respectively, by the colors of lights emitted by the quantum dots of the first color converting layer QD1 and the quantum dots of the second color converting layer QD2. For example, the light of the first wavelength width, which is emitted by the first organic light-emitting diode OLED1, may be converted into a red color light by the quantum dots of the first color converting layer QD1. The light of the first wavelength width, which is emitted by the second organic light-emitting diode OLED2, may be converted into a green color light by the quantum dots of the second color converting layer QD2.

As no color converting layers are included to correspond to the emission area EA of the third subpixel P3, the color of the third subpixel P3 may be determined by the color of light (e.g., light of a second wavelength width), which is emitted by the third organic light-emitting diode OLED3. For example, the light of the second wavelength width, which is emitted by the third organic light-emitting diode OLED3, may be transmitted through the transmissive window TW as a blue color light. For example, the first subpixel PX1 may be a red color subpixel, the second subpixel PX2 may be a green color subpixel, and the third subpixel PX3 may be a blue color subpixel.

According to some embodiments, as a transmissive window is applied instead of the second color converting layer QD2, the color of the second subpixel P2 may be realized as the color of light emitted by the second organic light-emitting diode OLED2.

The partition walls 210 may be between the first color converting layer QD1, the second color converting layer QD2, and the transmissive window TW to correspond to the non-emission area NEA. In detail, the partition walls 210 may be, for example, between the first color converting layer QD1 and the second color converting layer QD2, and between the second color converting layer QD2 and the transmissive window TW.

The partition walls 210 may include an organic material, and Cr, CrOx, Cr/CrOx, Cr/CrOx/CrNy, resin (e.g., a carbon pigment or an RGB mixed pigment), graphite, a non-Cr-based material, etc., as a material for adjusting an optical density. Alternatively, the partition walls 210 may include pigments of various colors such as red, green, and yellow. The partition walls 210 may serve as a black matrix for preventing color mixture and improving visibility.

First, second, and third color filters CF1, CF2, and CF3 and light barrier patterns BM may be between the upper substrate 200 and the first and second color converting layers QD1 and QD2 and the transmissive window TW.

The first, second, and third color filters CF1, CF2, and CF3 may be used to realize or generate a full-color image and to improve a color purity and outdoor visibility. The first color filter CF1 may transmit light converted by the first color converting layer QD1, and absorb non-converted light (e.g., light having the different wavelength from the light converted by the first color converting layer QD1). Similarly, the second color filter CF2 may transmit light converted by the second color converting layer QD2, and absorb non-converted light (e.g., light having the different wavelength from the light converted by the second color converting layer QD2). The third color filter CF3 may be implemented with the same color as the light emitted from the organic light-emitting diode OLED. The first, second, and third color filters CF1, CF2, and CF3 may suppress light emission by the quantum dots of the first and second color converting layers QD1 and QD2, by blocking incident light from outside.

According to some embodiments, the first color filter CF1 may have a red color, the second color filter CF2 may have a green color, and the third color filter CF3 may have a blue color.

The light barrier patterns BM may be between the first, second, and third color filters CF1, CF2, and CF3 to correspond to the non-emission area NEA. The light barrier patterns BM may improve color clarity and a contrast ratio, by serving as a black matrix. The light barrier patterns BM may include at least one of a black pigment, a black dye, and black particles. According to some embodiments, the light barrier patterns BM may include Cr, CrOx, Cr/CrOx, Cr/CrOx/CrNy, resin (e.g., a carbon pigment or an RGB mixed pigment), graphite, a non-Cr-based material, etc.

Adjacent color filters among the first, second, and third color filters CF1, CF2, and CF3 may be arranged to overlap each other in the non-emission area NEA. This overlapping arrangement of color filters of different colors may improve a light blocking rate. In other embodiments, the first, second, and third color filters CF1, CF2, and CF3 and the light barrier patterns BM may be omitted.

Figure 5:
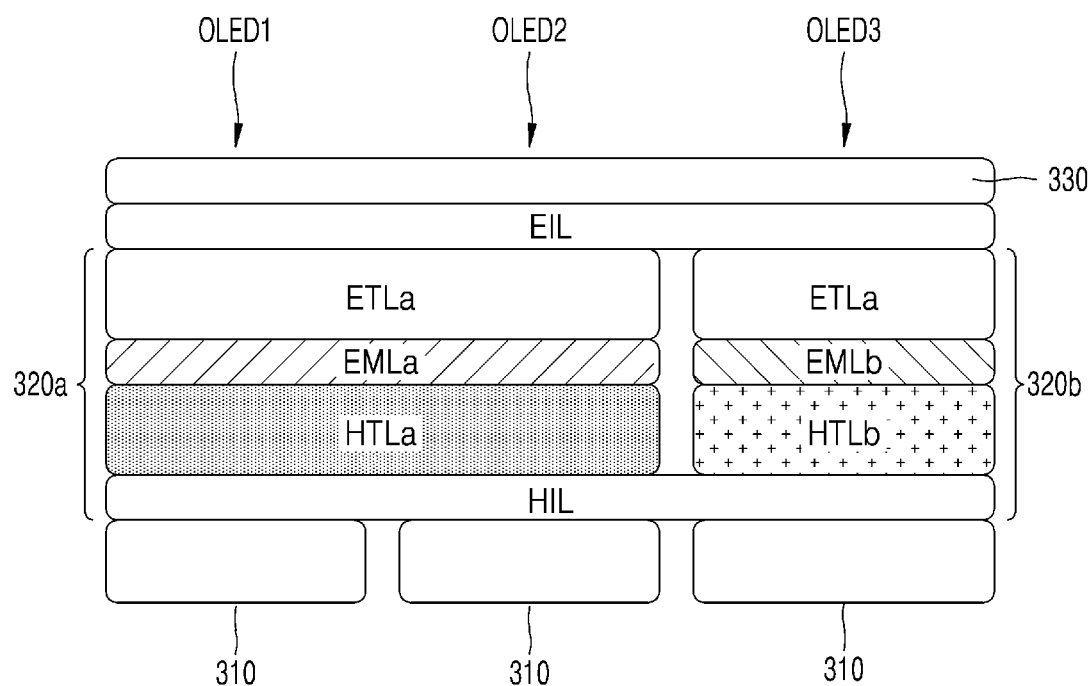
FIG. 5 is a cross-sectional view of embodiments of first, second, and third organic light-emitting diodes included in the display apparatuses of FIGS. 1A and 1B.

FIG. 5 is a schematic cross-sectional view of first, second, and third organic light-emitting diodes employable by the display apparatus according to the illustrative embodiment. The same reference numerals in FIGS. 4 and 5 denote the same elements, and thus repeated descriptions thereof are omitted for descriptive convenience.

Referring to FIG. 5, pixel electrodes 310 may be formed in the first, second, and third organic light-emitting diodes OLED1, OLED2, and OLED3, respectively, by a patterning process. An opposite electrode 330 for the first, second, and third organic light-emitting diodes OLED1, OLED2, and OLED3 may be integrally formed in the first, second, and third organic light-emitting diodes OLED1, OLED2, and OLED3.

The first and second organic light-emitting diodes OLED1 and OLED2 may include the first intermediate layer 320a, and the first intermediate layer 320a may include the first emission layer EMLa and the first hole transport layer HTLa. The first intermediate layer 320a may further include a hole injection layer HIL, a first electron transport layer ETLa, and an electron injection layer EIL. The hole injection layer HIL may be between the pixel electrodes 310 and a first hole transport layer HTLa. The first electron transport layer ETLa may be arranged over the first emission layer EMLa to transport electrons from the opposite electrode 330 to the first emission layer EMLa. The electron injection layer EIL may be between the first electron transport layer ETLa and the opposite electrode 330.

The third organic light-emitting diode OLED3 may include the second intermediate layer 320b. The second intermediate layer 320b may include the second emission layer EMLb and the second hole transport layer HTLb. The second intermediate layer 320b may further include a hole injection layer HIL, a second electron transport layer ETLb, and an electron injection layer EIL. The hole injection layer HIL may be between the pixel electrode 310 and the second hole transport layer HTLb. The second electron transport layer ETLb may be arranged over the second emission layer EMLb to transport electrons from the opposite electrode 330 to the second emission layer EMLb. The electron injection layer EIL may be between the second electron transport layer ETLb and the opposite electrode 330.

The first and second electron transport layers ETLa and ETLb may smoothly transport electrons, and may include at least one of tris(8-hydroxyquinolino)aluminum (Alq3), PBD, TAZ, Spiro-PBD, BAlq, lithium quinolate (Liq), BMB-3T, PF-6P, TPBI, COT and Salq. However, embodiments are not limited thereto. According to some embodiments, the first electron transport layer ETLa may include a material different from that included in the second electron transport layer ETLb.

The hole injection layer HIL is commonly applicable to the first, second, and third organic light-emitting diodes OLED1, OLED2, and OLED3. The hole injection layer HIL may smoothly inject holes, and may include at least one of HATCN, copper phthalocyanine (CuPc), poly(3,4)-ethylenedioxythiophene (PEDOT), polyaniline (PANT), and N,N-dinaphthyl-N,N'-diphenylbenzidine (NPD). However, embodiments are not limited thereto.

The electron injection layer EIL is commonly applicable to the first, second, and third organic light-emitting diodes OLED1, OLED2, and OLED3. The electron injection layer EIL may use Yb, tris(8-hydroxyquinolino)aluminum (Alq3), PBD, TAZ, Spiro-PBD, Balq, or Salq, but embodiments are not limited thereto.

According to the illustrative embodiment, the first organic light-emitting diode OLED1 and the second organic light-emitting diode OLED2 may commonly include the first emission layer EMLa and the first hole transport layer HTLa, and the third organic light-emitting diode OLED3 may include the second emission layer EMLb and the second hole transport layer HTLb.

The first emission layer EMLa may emit light of a different color from the color of the light emitted by the second emission layer EMLb. According to some embodiments, the first emission layer EMLa may include an organic material that emits green light, and the second emission layer EMLb may include an organic material that emits blue light.

The first emission layer EMLa may be formed by using, for example, green dopants in a certain host material. The second emission layer EMLb may be formed by using, for example, blue dopants in a certain host material.

The first hole transport layer HTLa may be between the pixel electrodes 310 and the first emission layer EMLa of the first organic light-emitting diode OLED1 and the second organic light-emitting diode OLED2, and the second hole transport layer HTLb may be between the pixel electrode 310 and the second emission layer EMLb of the third organic light-emitting diode OLED3.

According to the illustrative embodiment, a hole mobility of the first hole transport layer HTLa may be different from a hole mobility of the second hole transport layer HTLb. According to some embodiments, the hole mobility of the first hole transport layer HTLa may be less than the hole mobility of the second hole transport layer HTLb.

According to some embodiments, the first hole transport layer HTLa and the second hole transport layer HTLb may include, as the hosts of a hole transport layer, a triphenylamine derivative having a high hole mobility and a good stability, such as N, N'-diphenyl-N,N'-bis(3-methylphenyl)-1,1'-bi-phenyl-4,4'-diamine (TPD) or N,N'-di(naphthalen-1-yl)-N,N'-diphenyl-benzidine (NPB).

To adjust the hole mobilities of the first hole transport layer HTLa and the second hole transport layer HTLb, the hosts of the first hole transport layer HTLa may be doped with P-type organic dopants, thereby increasing the hole mobility. The P-type organic dopants may be quinone derivatives such as tetracyanoquinonedimethane (TCNQ) and 2,3,5,6-tetrafluoro-tetracyano-1,4-benzoquinonedimethane (F4-TCNQ), or a cyano group-containing compound such as 2-(7-dicyanomethylene-1,3,4,5,6,8,9,10-octafluoro-7H-pyrene-2-ylidene)-malononitrile (NDP-9; a commercial product by Novaled Corporation).

A doping concentration of the P-type organic dopants may be about 0.5% to about 25%.

The hole mobility of the second hole transport layer HTLb may be reduced by doping the hosts with oxide having a high dielectric constant. The dielectric constant of the oxide may be in the range of about 3 to about 60. The oxide may include one of $HfO_x$, $ZrO_x$, $LaO_x$, $La_2O_3$, $LaAlO_x$, $TaO_x$, $AlO_x$, $Al_2O_3$, $SiO_2$, $ZrSiO_4$, $HfSiO_4$, SrO, $Y_2O_3$, CaO, BaO, BaZrO, MgO, $TiO_2$, and $Si_3N_4$. In this case, a doping concentration of the oxide may be about 0.5% to about 30%. When oxide having a low dielectric constant is added to the second hole transport layer HTLb, movement of charges may be rapidly limited, and thus the role of the second hole transport layer HTLb may not be properly performed. According to the illustrative embodiment, as oxide having a high dielectric constant is doped, charge movement may be performed by a dipole. In other words, according to the illustrative embodiment, as oxide having a high dielectric constant is doped, the role of the second hole transport layer HTLb may be performed and also the hole mobility may be adjusted.

According to another embodiment, the hole mobilities of the first hole transport layer HTLa and the second hole transport layer HTLb may be adjusted by doping the hosts of both the first hole transport layer HTLa and the second hole transport layer HTLb with oxide having a high dielectric constant. For example, a doping concentration of oxide doped in the first hole transport layer HTLa is less than that of oxide doped in the second hole transport layer HTLb so that the hole mobility of the first hole transport layer HTLa may be higher than that of the second hole transport layer HTLb.

Figure 6:
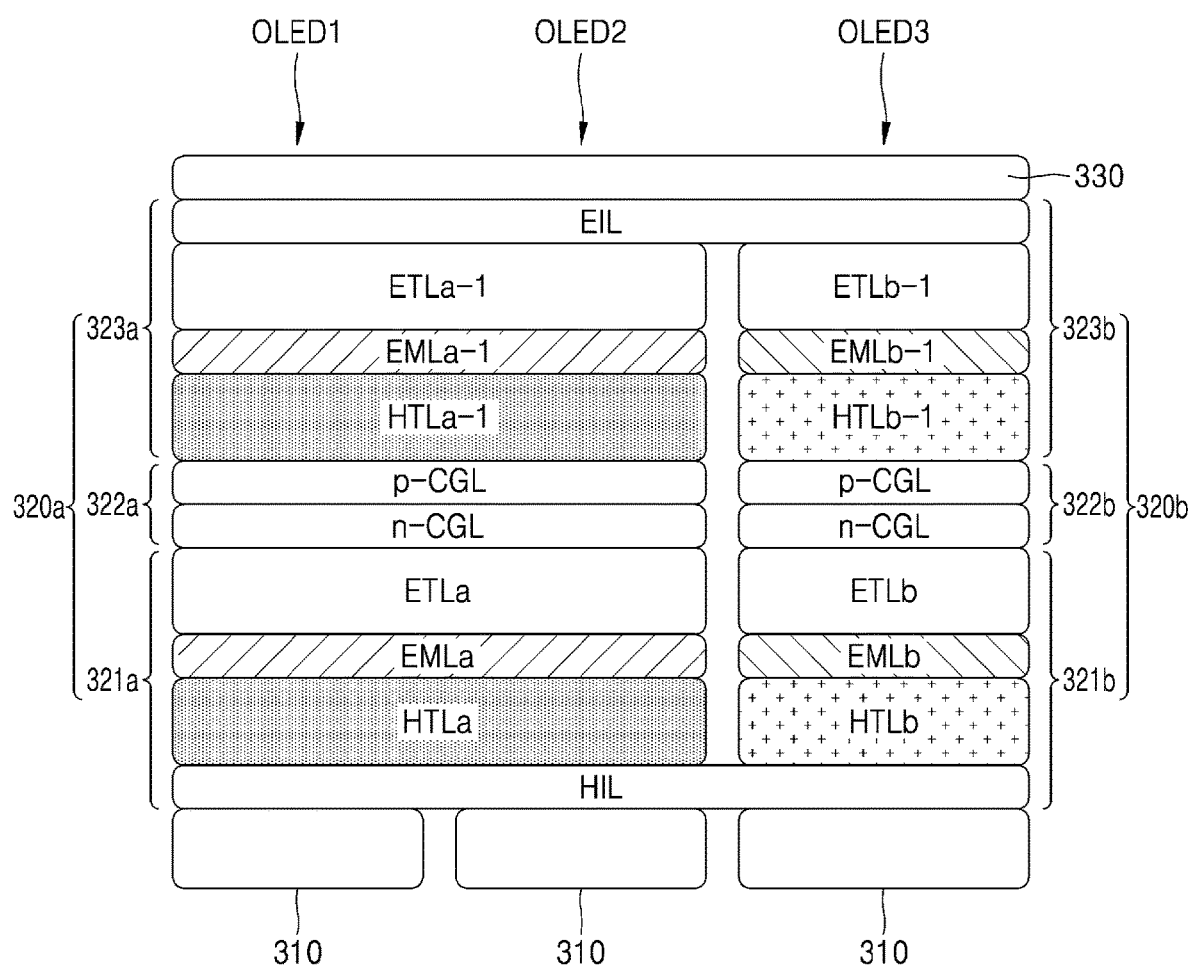
FIG. 6 is a cross-sectional view of other embodiments of first, second, and third organic light-emitting diodes included in the display apparatuses of FIGS. 1A and 1B.

FIG. 6 is a schematic cross-sectional view of first, second, and third organic light-emitting diodes employable by the display apparatus according to the illustrative embodiment. The same reference numerals in FIGS. 5 and 6 denote the same elements, and thus repeated descriptions thereof are omitted for descriptive convenience.

Referring to FIG. 6, first and second intermediate layers 320a and 320b of the first, second, and third organic light-emitting diodes OLED1, OLED2, and OLED3 may each include a stack of a plurality of emission layers.

For example, the first intermediate layer 320a of the first and second organic light-emitting diodes OLED1 and OLED2 may include a 1-1$^{st}$ emission layer EMLa-1 over the first emission layer EMLa. The 1-1$^{st}$ emission layer EMLa-1 may include the same material as that included in the first emission layer EMLa. For example, the first emission layer EMLa and the 1-1$^{st}$ emission layer EMLa-1 may include an organic material that emits green light.

The second intermediate layer 320b of the third organic light-emitting diode OLED3 may include a 2-1$^{st}$ emission layer EMLb-1 over the second emission layer EMLb. The 2-1$^{st}$ emission layer EMLb-1 may include the same material as that included in the second emission layer EMLb. For example, the second emission layer EMLb and the 2-1$^{st}$ emission layer EMLb-1 may include an organic material that emits blue light.

According to some embodiments, the first intermediate layer 320a may include a first stack 321a including the first emission layer EMLa, a 1-1$^{st}$ stack 323a including the 1-1$^{st}$ emission layer EMLa-1, and a charge generation layer 322a between the first stack 321a and the 1-1$^{st}$ stack 323a.

The first stack 321a may have a structure in which the hole injection layer HIL, the first hole transport layer HTLa, the first emission layer EMLa, and the first electron transport layer ETLa are sequentially stacked. The 1-1$^{st}$ stack 323a may have a structure in which a 1-1$^{st}$ hole transport layer HTLa-1, the 1-1$^{st}$ emission layer EMLa-1, and a 1-1$^{st}$ electron transport layer ETLa-1 are sequentially stacked.

The charge generation layer 322a may supply charges to the first stack 321a and the 1-1$^{st}$ stack 323a. The charge generation layer 322a may include an n-type charge generation layer n-CGL for supplying electrons to the first stack 321a, and a p-type charge generation layer p-CGL for supplying holes to the 1-1$^{st}$ stack 323a. The n-type charge generation layer n-CGL may include a metal material as dopants.

Similarly, the second intermediate layer 320b may include a second stack 321b including the second emission layer EMLb, a 2-1$^{st}$ stack 323b including the 2-1$^{st}$ emission layer EMLb-1, and a charge generation layer 322b between the second stack 321b and the 2-1$^{st}$ stack 323b.

The second stack 321b may have a structure in which the hole injection layer EEL, the second hole transport layer HTLb, the second emission layer EMLb, and the second electron transport layer ETLb are sequentially stacked. The 2-1$^{st}$ stack 323b may have a structure in which a 2-1$^{st}$ hole transport layer HTLb-1, the 2-1$^{st}$ emission layer EMLb-1, and a 2-1$^{st}$ electron transport layer ETLb-1 are sequentially stacked.

The charge generation layer 322b may supply charges to the second stack 321b and the 2-1$^{st}$ stack 323b. The charge generation layer 322b may include an n-type charge generation layer n-CGL for supplying electrons to the second stack 321b, and a p-type charge generation layer p-CGL for supplying holes to the 2-1$^{st}$ stack 323b. The n-type charge generation layer n-CGL may include a metal material as dopants.

Some members of the first intermediate layer 320a may include the same material as some members of the second intermediate layer 320b. For example, the hole injection layer HIL and the electron injection layer EIL are commonly applicable to the first intermediate layer 320a and the second intermediate layer 320b.

According to the illustrative embodiment, hole mobilities of the first hole transport layer HTLa and the 1-1$^{st}$ hole transport layer HTLa-1 may be different from hole mobilities of the second hole transport layer HTLb and the 2-1$^{st}$ hole transport layer HTLb-1. According to some embodiments, the hole mobilities of the first hole transport layer HTLa and the 1-1$^{st}$ hole transport layer HTLa-1 may be less than the hole mobilities of the second hole transport layer HTLb and the 2-1$^{st}$ hole transport layer HTLb-1.

To increase the hole mobilities of the first hole transport layer HTLa and the 1-1$^{st}$ hole transport layer HTLa-1, the hosts of the first hole transport layer HTLa and the 1-1$^{st}$ hole transport layer HTLa-1 may be doped with P-type organic dopants. The P-type organic dopants may be quinone derivatives such as tetracyanoquinonedimethane (TCNQ) and 2,3,5,6-tetrafluoro-tetracyano-1,4-benzoquinonedimethane (F4-TCNQ), or a cyano group-containing compound such as 2-(7-dicyanomethylene-1,3,4,5,6,8,9,10-octafluoro-7H-pyrene-2-ylidene)-malononitrile (NDP-9; a commercial product by Novaled Corporation).

A doping concentration of the P-type organic dopants may be about 0.5% to about 25%.

The hole mobilities of the second hole transport layer HTLb and the 2-1$^{st}$ hole transport layer HTLb-1 may be reduced by doping the hosts thereof with oxide having a high dielectric constant. The dielectric constant of the oxide may be in the range of about 3 to about 60. The oxide may include one of $HfO_X$, $ZrO_X$, $LaO_X$, $La_2O_3$, $LaAlO_X$, $TaO_X$, $AlO_X$, $Al_2O_3$, $SiO_2$, $ZrSiO_4$, $HfSiO_4$, $SrO$, $Y_2O_3$, $CaO$, $BaO$, $BaZrO$, $MgO$, $TiO_2$, and $Si_3N_4$. In this case, a doping concentration of the oxide may be about 0.5% to about 30%.

According to another embodiment, the hole mobilities of the first hole transport layer HTLa, the 1-1$^{st}$ hole transport layer HTLa-1, the second hole transport layer HTLb, and the 2-1$^{st}$ hole transport layer HTLb-1 may be adjusted by doping the hosts of all of the first hole transport layer HTLa, the 1-1$^{st}$ hole transport layer HTLa-1, the second hole transport layer HTLb, and the 2-1$^{st}$ hole transport layer HTLb-1 with oxide having a high dielectric constant. For example, a doping concentration of oxide doped in the first hole transport layer HTLa and the 1-1$^{st}$ hole transport layer HTLa-1 is less than that of oxide doped in the second hole transport layer HTLb and the 2-1$^{st}$ hole transport layer HTLb-1 so that the hole mobility of the first hole transport layer HTLa may be higher than that of the second hole transport layer HTLb.

Figure 7:
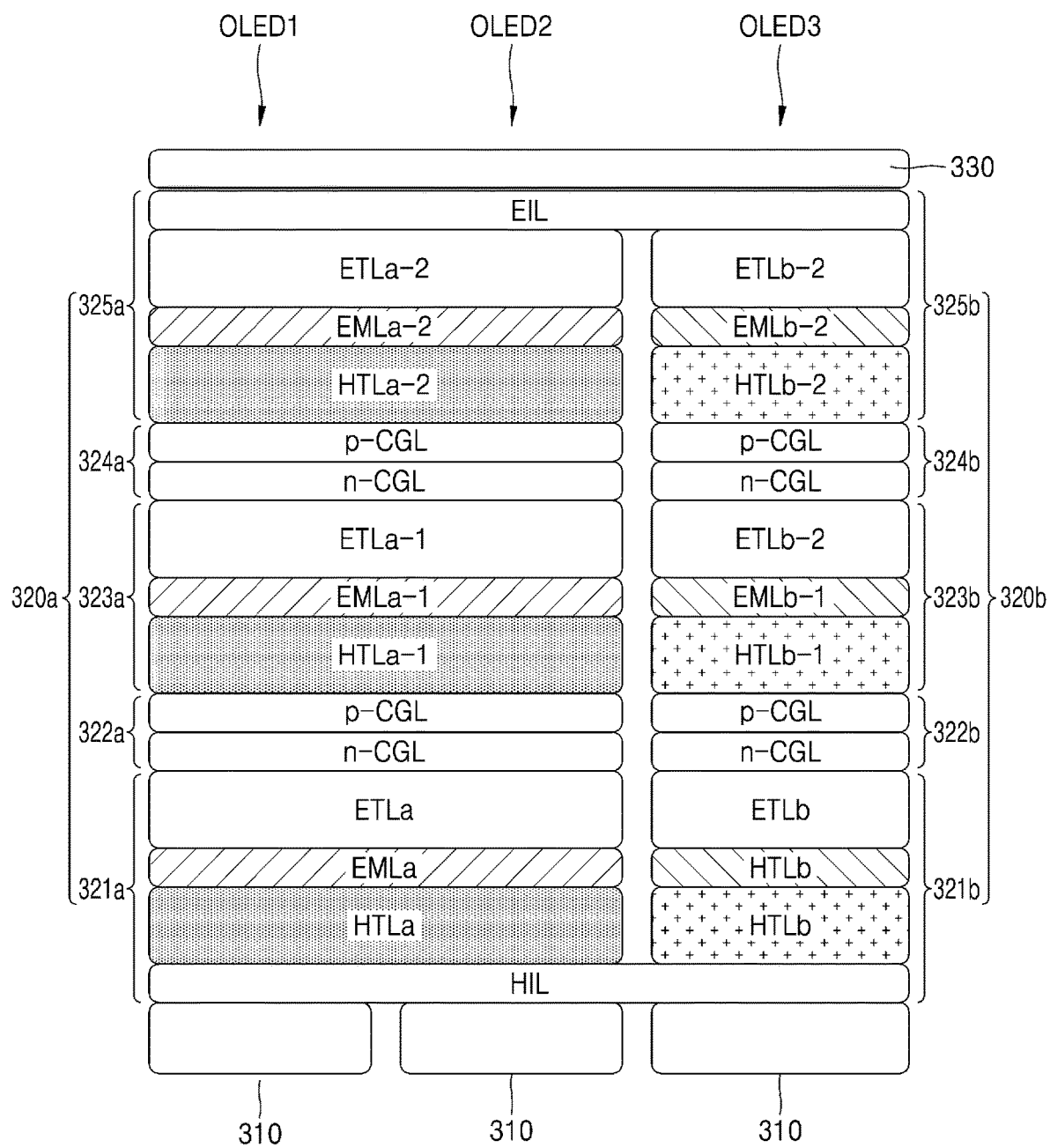
FIG. 7 is a cross-sectional view of other embodiments of first, second, and third organic light-emitting diodes included in the display apparatuses of FIGS. 1A and 1B.
Figure 8:
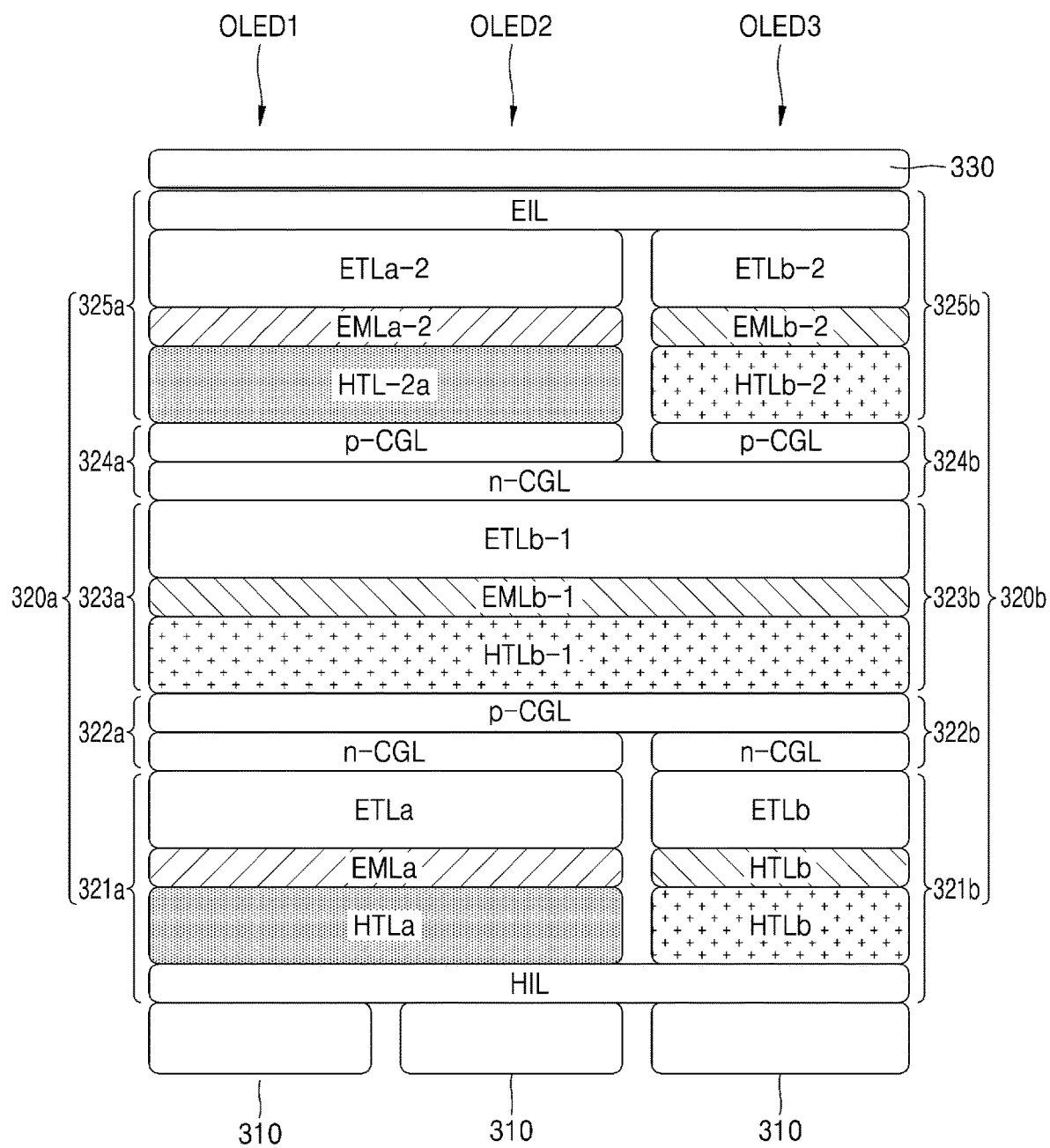
FIG. 8 is a cross-sectional view of other embodiments of first, second, and third organic light-emitting diodes included in the display apparatuses of FIGS. 1A and 1B.

FIGS. 7 and 8 are schematic cross-sectional views of first, second, and third organic light-emitting diodes employable by the display apparatus according to the illustrative embodiment. The same reference numerals in FIG. 6 and FIGS. 7 and 8 denote the same elements, and thus repeated descriptions thereof are omitted for descriptive convenience.

Referring to FIGS. 7 and 8, first and second intermediate layers 320a and 320b of the first, second, and third organic light-emitting diodes OLED1, OLED2, and OLED3 may each include a stack of a plurality of emission layers. Although three emission layers are stacked in FIGS. 7 and 8, embodiments are not limited thereto. Four or more emission layers may be included.

For example, the first intermediate layer 320a of the first and second organic light-emitting diodes OLED1 and OLED2 may include a $1\text{-}1^{st}$ emission layer EMLa-1 and a $1\text{-}2^{nd}$ emission layer EMLa-2 stacked over the first emission layer EMLa.

According to some embodiments, the first emission layer EMLa, the $1\text{-}1^{st}$ emission layer EMLa-1, and the $1\text{-}2^{nd}$ emission layer EMLa-2 may include a material that emits the same color. For example, the first emission layer EMLa, the $1\text{-}1^{st}$ emission layer EMLa-1, and the $1\text{-}2^{nd}$ emission layer EMLa-2 may include an organic material that emits green light.

According to another embodiment, at least one of the first emission layer EMLa, the $1\text{-}1^{st}$ emission layer EMLa-1, and the $1\text{-}2^{nd}$ emission layer EMLa-2 may include a material that emits a different color from the color of light emitted by the others. For example, the first emission layer EMLa, the $1\text{-}1^{st}$ emission layer EMLa-1, and the $1\text{-}2^{nd}$ emission layer EMLa-2 may include an organic material that sequentially emits green light, blue light, and green light or an organic material that sequentially emits blue light, green light, and green light.

The second intermediate layer 320b of the third organic light-emitting diode OLED3 may include a $2\text{-}1^{st}$ emission layer EMLb-1 and a $2\text{-}2^{nd}$ emission layer EMLb-2 stacked over the second emission layer EMLb. All of the second emission layer EMLb, the $2\text{-}1^{st}$ emission layer EMLb-1, and the $2\text{-}2^{nd}$ emission layer EMLb-2 may include a material that emits the same color. For example, all of the second emission layer EMLb, the $2\text{-}1^{st}$ emission layer EMLb-1, and the $2\text{-}2^{nd}$ emission layer EMLb-2 may include a material that emits blue light.

According to some embodiments, the first intermediate layer 320a may include a first stack 321a including the first emission layer EMLa, a $1\text{-}1^{st}$ stack 323a including the $1\text{-}1^{st}$ emission layer EMLa-1, a $1\text{-}2^{nd}$ stack 325a including the $1\text{-}2^{nd}$ emission layer EMLa-2, and charge generation layers 322a and 324a between the first stack 321a, the $1\text{-}1^{st}$ stack 323a, and the $1\text{-}2^{nd}$ stack 325a. The $1\text{-}2^{nd}$ stack 325a may have a structure in which a $1\text{-}2^{nd}$ hole transport layer HTLa-2, the $1\text{-}2^{nd}$ emission layer EMLa-2, a $1\text{-}2^{nd}$ electron transport layer ETLa-2, and the electron injection layer EIL are sequentially stacked.

Similarly, the second intermediate layer 320b may include a second stack 321b including the second emission layer EMLb, a $2\text{-}1^{st}$ stack 323b including the $2\text{-}1^{st}$ emission layer EMLb-1, a $2\text{-}2^{nd}$ stack 325b including the $2\text{-}2^{nd}$ emission layer EMLb-2, and charge generation layers 322b and 324b between the second stack 321b, the $2\text{-}1^{st}$ stack 323b, and the $2\text{-}2^{nd}$ stack 325b. The $2\text{-}2^{nd}$ stack 325b may have a structure in which a $2\text{-}2^{nd}$ hole transport layer HTLb-2, the $2\text{-}2^{nd}$ emission layer EMLb-2, a $2\text{-}2^{nd}$ electron transport layer ETLb-2, and the electron injection layer EIL are sequentially stacked.

Some members of the first intermediate layer 320a may include the same material as some members of the second intermediate layer 320b. For example, the hole injection layer HIL and the electron injection layer EIL are commonly applicable to the first intermediate layer 320a and the second intermediate layer 320b.

As shown in FIG. 8, one of the stacks included in the first intermediate layer 320a and one of the stacks included in the second intermediate layer 320b may include the same material. In FIG. 8, the $2\text{-}1^{st}$ stack 323b of the second intermediate layer 320b is commonly applied to the first intermediate layer 320a and the second intermediate layer 320b. However, embodiments are not limited thereto. The second stack 323b or the $2\text{-}2^{nd}$ stack 325b is commonly applicable to the first intermediate layer 320a and the second intermediate layer 320b.

Figure 9:
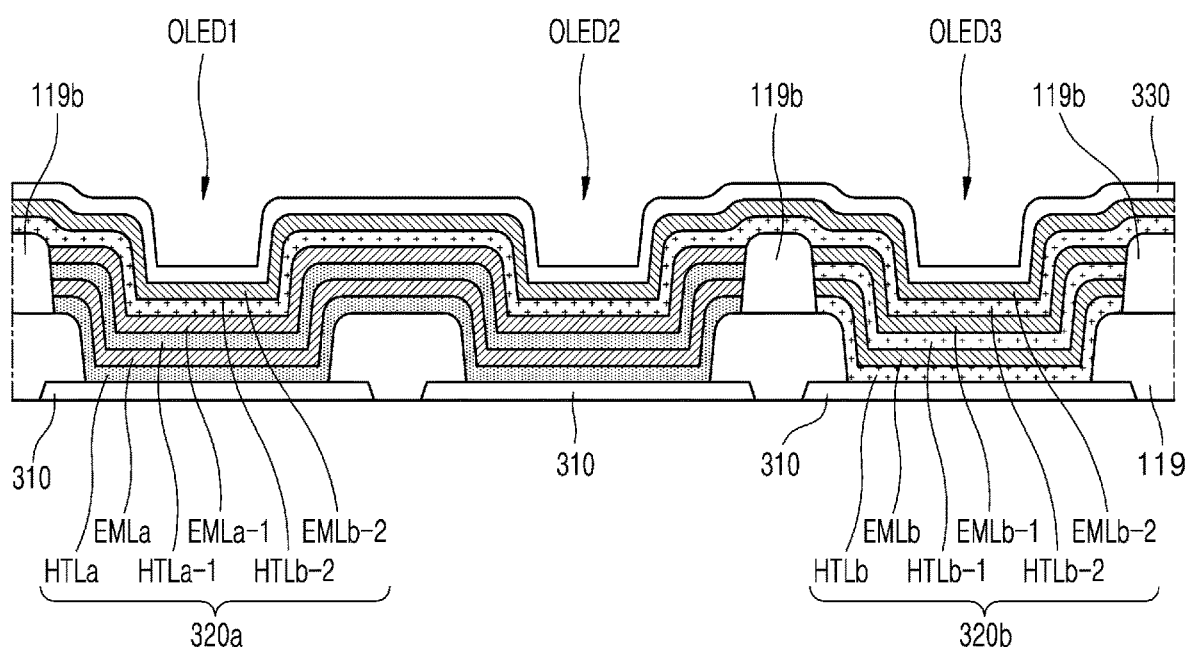
FIG. 9 is a cross-sectional view of a portion of the display apparatuses of FIGS. 1A and 1B.

FIG. 9 is a cross-sectional view of a portion of a display apparatus according to an embodiment. In detail, FIG. 9 illustrates first, second, and third organic light-emitting diodes and banks according to an embodiment. The same reference numerals in FIGS. 7 and 9 denote the same elements, and thus repeated descriptions thereof are omitted for descriptive convenience.

Referring to FIG. 9, the emission areas of the first, second, and third organic light-emitting diodes OLED1, OLED2, and OLED3 may be defined by the openings of the pixel defining layer 119. The banks 119b may be arranged over the pixel defining layer 119 to separate the first emission layer EMLa included in the first and second organic light-emitting diodes OLED1 and OLED2 from the second emission layer EMLb included in the third organic light-emitting diode OLED3.

First and second intermediate layers 320a and 320b of the first, second, and third organic light-emitting diodes OLED1, OLED2, and OLED3 may each include a stack of a plurality of emission layers. For example, the first intermediate layer 320a of the first and second organic light-emitting diodes OLED1 and OLED2 may include the $1\text{-}1^{st}$ emission layer EMLa-1 and the $2\text{-}2^{nd}$ emission layer EMLb-2 stacked over the first emission layer EMLa. The second intermediate layer 320b of the third organic light-emitting diode OLED3 may include the $2\text{-}1^{st}$ emission layer EMLb-1 and the $2\text{-}2^{nd}$ emission layer EMLb-2 stacked over the second emission layer EMLb.

The first hole transport layer HTLa may be arranged below the first emission layer EMLa, and the $1\text{-}1^{st}$ hole transport layer HTLa-1 may be arranged below the $1\text{-}1^{st}$ emission layer EMLa-1. The second hole transport layer HTLb may be arranged below the second emission layer EMLb, the $2\text{-}1^{st}$ hole transport layer HTLb-1 may be arranged below the $2\text{-}1^{st}$ emission layer EMLb-1, and the $2\text{-}2^{nd}$ hole transport layer HTLb-2 may be arranged below the $2\text{-}2^{nd}$ emission layer EMLb-2.

According to the illustrative embodiment, the $2\text{-}2^{nd}$ emission layer EMLb-2, which is an emission layer arranged at the top, and the $2\text{-}2^{nd}$ hole transport layer HTLb-2 arranged therebelow may be integrally formed in the first intermediate layer 320a and the second intermediate layer 320b. The first emission layer EMLa and the second emission layer EMLb may be separated from the $1\text{-}1^{st}$ emission layer EMLa and the $2\text{-}1^{st}$ emission layer EMLb-1 by the banks 119b.

The first emission layer EMLa and the $1\text{-}1^{st}$ emission layer EMLa-1 may include an organic material that emits green light. The second emission layer EMLb, the $2\text{-}1^{st}$ emission layer EMLb-1, and the $2\text{-}2^{nd}$ emission layer EMLb-2 may include a material that emits blue light.

As described above, in the display apparatus according to an embodiment, an emission layer and a hole transport layer of a first subpixel and a second subpixel are different from an emission layer and a hole transport layer of a third subpixel. Thus, power consumption may be reduced and durability may be improved.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display apparatus comprising a first subpixel for emitting a first color light, a second subpixel for emitting a second color light, and a third subpixel for emitting a third color light, the display apparatus comprising:
a first organic light-emitting diode of the first subpixel, a second organic light-emitting diode of the second subpixel, and a third organic light-emitting diode of the third subpixel arranged on a substrate;
a first intermediate layer commonly included in the first organic light-emitting diode and the second organic light-emitting diode, the first intermediate layer comprising a first emission layer and a first hole transport layer;
a second intermediate layer included in the third organic light-emitting diode, the second intermediate layer comprising a second emission layer and a second hole transport layer; and
a first color converting layer, a second color converting layer, and a third color converting layer arranged to overlap the first organic light-emitting diode, the second organic light-emitting diode, and the third organic light-emitting diode, respectively,
wherein the first emission layer and the second emission layer are configured to emit different color lights from each other,
wherein a hole mobility of the first hole transport layer is different from a hole mobility of the second hole transport layer,
wherein the first hole transport layer is formed by doping a host of an organic material with an oxide comprising at least one of $HfO_x$, $ZrO_x$, $LaO_x$, $La_2O_3$, $LaAlO_x$, $TaO_x$, $AlO_x$, $Al_2O_3$, $SiO_2$, $ZrSiO_4$, $HfSiO_4$, $SrO$, $Y_2O_3$, $CaO$, $BaO$, $BaZrO$, $MgO$, $TiO_2$, or $Si_3N_4$,
wherein the first hole transport layer and the second hole transport layer do not overlap in a thickness direction.

2. The display apparatus of claim 1, wherein the second hole transport layer is formed by doping the host of the organic material with a p-type organic dopant.

3. The display apparatus of claim 2, wherein a dielectric constant of the oxide is about 3 to about 60.

4. The display apparatus of claim 1, wherein a doping concentration of the oxide is about 0.5% to about 30%.

5. The display apparatus of claim 2, wherein the p-type organic dopant comprises a cyano group-containing compound, and
wherein a doping concentration of the p-type organic dopant is about 0.5% to about 25%.

6. The display apparatus of claim 1, wherein the first hole transport layer is formed by doping the host of the organic material with an oxide at a first doping concentration,
wherein the second hole transport layer is formed by doping the host of the organic material with the oxide at a second doping concentration, and
wherein the first doping concentration is different from the second doping concentration.

7. The display apparatus of claim 1, further comprising a bank arranged on the substrate and between the first emission layer and the second emission layer.

8. The display apparatus of claim 7, wherein the bank is arranged on a pixel defining layer that defines an emission area of the first, second, and third organic light-emitting diodes, and surrounds the third organic light-emitting diode.

9. The display apparatus of claim 1, wherein the first intermediate layer further comprises a 1-$1^{st}$ emission layer arranged on the first emission layer, and
wherein the second intermediate layer further comprises a 2-$1^{st}$ emission layer arranged on the second emission layer.

10. The display apparatus of claim 9, wherein the 1-$1^{st}$ emission layer comprises a same material as a material included in the 2-1st emission layer.

11. The display apparatus of claim 1, wherein the first emission layer is configured to emit a green light,
wherein the second emission layer is configured to emit a blue light,
wherein the first hole transport layer is doped with a p-type organic dopant, and
wherein the second hole transport layer is doped with an oxide.

12. A display apparatus comprising a first subpixel for emitting a first color light, a second subpixel for emitting a second color light, and a third subpixel for emitting a third color light, the display apparatus comprising:
a first organic light-emitting diode of the first subpixel, a second organic light-emitting diode of the second subpixel, and a third organic light-emitting diode of the third subpixel arranged on a substrate;
a first intermediate layer commonly included in the first organic light-emitting diode and the second organic light-emitting diode, the first intermediate layer comprising a first emission layer and a first hole transport layer;
a second intermediate layer included in the third organic light-emitting diode, the second intermediate layer comprising a second emission layer and a second hole transport layer; and
a bank arranged on the substrate to surround at least a portion of the second intermediate layer,
wherein the first emission layer and the second emission layer are configured to emit different color lights from each other,
wherein the first hole transport layer is formed by doping a host of an organic material with an oxide comprising one of $HfO_x$, $ZrO_x$, $LaO_x$, $La_2O_3$, $LaAlO_x$, $TaO_x$, $AlO_x$, $Al_2O_3$, $SiO_2$, $ZrSiO_4$, $HfSiO_4$, $SrO$, $Y_2O_3$, $CaO$, $BaO$, $BaZrO$, $MgO$, $TiO_2$, or $Si_3N_4$,
wherein the first hole transport layer and the second hole transport layer do not overlap in a thickness direction, and
wherein a hole mobility of the first hole transport layer is different from a hole mobility of the second hole transport layer.

13. The display apparatus of claim 12, wherein the first emission layer is configured to emit a green light, and
wherein the second emission layer is configured to emit a blue light.

14. The display apparatus of claim 13, wherein the second hole transport layer is formed by doping the host of the organic material with a p-type organic dopant.

15. The display apparatus of claim 14, wherein the p-type organic dopant is a cyano group-containing compound, and a doping concentration of the p-type organic dopant is about 0.5% to about 25%.

16. The display apparatus of claim 12, wherein the first intermediate layer further comprises a 1-1$^{st}$ emission layer arranged on the first emission layer, and wherein the second intermediate layer further comprises a 2-1$^{st}$ emission layer arranged on the second emission layer.

17. The display apparatus of claim 16, wherein the 1-1$^{st}$ emission layer comprises a same material as a material included in the 2-1$^{st}$ emission layer.

* * * * *